(12) United States Patent
Tsukiyama et al.

(10) Patent No.: US 11,901,268 B2
(45) Date of Patent: Feb. 13, 2024

(54) PACKAGE WITH AN ELECTRODE-ATTACHED FRAME SUPPORTED BY A HEAT SINK, AND METHOD FOR MANUFACTURING POWER SEMICONDUCTOR MODULE PROVIDED THEREWITH

(71) Applicants: NGK Electronics Devices, Inc., Mine (JP); NGK Insulators, Ltd., Nagoya (JP)

(72) Inventors: Yoshio Tsukiyama, Yamaguchi (JP); Teppei Yamaguchi, Shimonoseki (JP)

(73) Assignees: NGK Electronics Devices, Inc., Mine (JP); NGK INSULATORS, LTD., Nagoya (JP)

( * ) Notice: Subject to any disclaimer, the term of this patent is extended or adjusted under 35 U.S.C. 154(b) by 131 days.

(21) Appl. No.: 17/455,709

(22) Filed: Nov. 19, 2021

(65) Prior Publication Data

US 2022/0077033 A1    Mar. 10, 2022

Related U.S. Application Data

(63) Continuation of application No. PCT/JP2020/017028, filed on Apr. 20, 2020.

(30) Foreign Application Priority Data

Jun. 25, 2019   (JP) .................... 2019-117393

(51) Int. Cl.
*H01L 23/495* (2006.01)
*H01L 21/48* (2006.01)
(Continued)

(52) U.S. Cl.
CPC .... *H01L 23/49568* (2013.01); *H01L 21/4821* (2013.01); *H01L 21/4871* (2013.01);
(Continued)

(58) Field of Classification Search
CPC . H01L 21/4821; H01L 21/4871; H01L 24/48; H01L 24/49; H01L 24/45;
(Continued)

(56) References Cited

U.S. PATENT DOCUMENTS

| 2003/0038362 A1* | 2/2003 | Nomura .............. H01L 24/49 |
| | | 257/E23.101 |
| 2007/0090514 A1* | 4/2007 | Condie ............... H01L 23/10 |
| | | 257/E23.188 |
| 2007/0090515 A1 | 4/2007 | Condie et al. |

FOREIGN PATENT DOCUMENTS

| JP | 2003-282751 A | 10/2003 |
| JP | 2004-179584 A | 6/2004 |

(Continued)

OTHER PUBLICATIONS

International Search Report and Written Opinion (Application No. PCT/JP2020/017028) dated Jul. 21, 2020 (with English translation).

(Continued)

*Primary Examiner* — Alonzo Chambliss
(74) *Attorney, Agent, or Firm* — BURR PATENT LAW, PLLC

(57) ABSTRACT

An external terminal electrode is attached to a frame, and the frame contains a first resin, and has a first adhered surface. A heat sink plate supports the frame, has an unmounted region where a power semiconductor element is to be mounted within the frame in plan view, is made of metal, and has a second adhered surface. An adhesive layer contains a second resin different from the first resin, and adheres the first adhered surface of the frame and the second adhered surface of the heat sink plate to each other. One of the first and second adhered surfaces includes a flat portion and a protruding portion. The protruding portion protrudes from (Continued)

the flat portion and opposes the other one of the first adhered surface and the second adhered surface with the adhesive layer therebetween.

11 Claims, 18 Drawing Sheets

(51) Int. Cl.
    *H01L 23/00*     (2006.01)
    *H01L 23/66*     (2006.01)

(52) U.S. Cl.
    CPC ........ *H01L 23/49562* (2013.01); *H01L 24/83* (2013.01); *H01L 23/66* (2013.01); *H01L 24/46* (2013.01); *H01L 24/49* (2013.01); *H01L 24/85* (2013.01)

(58) Field of Classification Search
    CPC ......... H01L 24/46; H01L 24/83; H01L 24/85; H01L 23/49568; H01L 23/49562
    See application file for complete search history.

(56) References Cited

FOREIGN PATENT DOCUMENTS

| | | |
|---|---|---|
| JP | 2005-150133 A | 6/2005 |
| JP | 2005-322697 A | 11/2005 |
| JP | 2007-165486 A | 6/2007 |
| JP | 2009-513026 A | 3/2009 |
| JP | 2012-049224 A | 3/2012 |
| JP | 2018-142617 A | 9/2018 |
| WO | 2007/050287 A2 | 5/2007 |
| WO | 2018/225511 A1 | 12/2018 |

OTHER PUBLICATIONS

Japanese Office Action (Application No. 2021-527413) dated Nov. 29, 2022 (with English translation).

* cited by examiner

F I G. 4
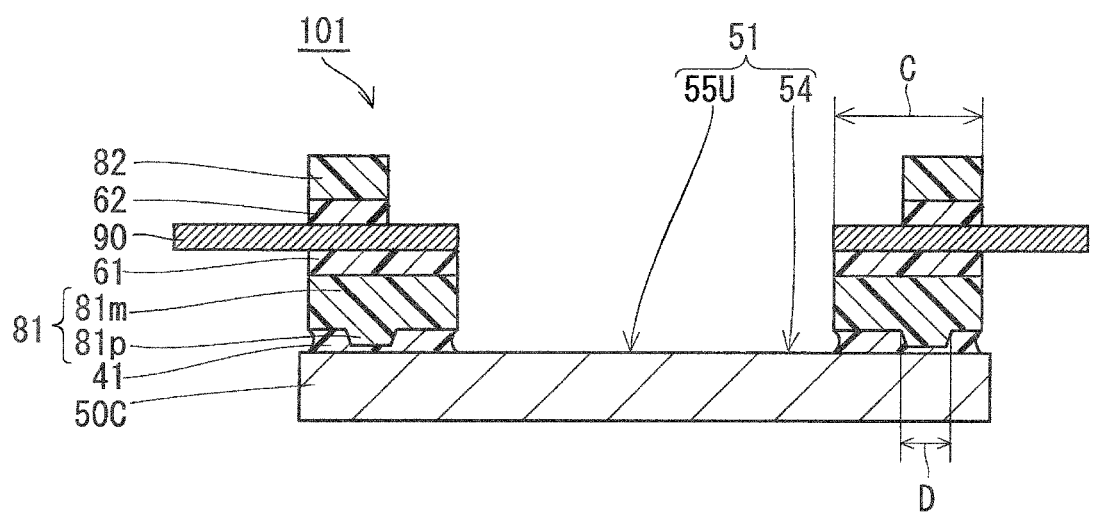

PACKAGE WITH AN ELECTRODE-ATTACHED FRAME SUPPORTED BY A HEAT SINK, AND METHOD FOR MANUFACTURING POWER SEMICONDUCTOR MODULE PROVIDED THEREWITH

BACKGROUND OF THE INVENTION

Field of the Invention

The present invention relates to a package and a method for manufacturing a power semiconductor module, and, in particular, to a package to which a lid is to be attached to form a sealed space for sealing a power semiconductor element without a gross leak and a method for manufacturing a power semiconductor module including the power semiconductor element sealed without a gross leak.

Description of the Background Art

A container forming a sealed space for sealing a power semiconductor element is required to be highly hermetic not to cause a gross leak depending on a type and a use of the power semiconductor element. In particular, a high frequency semiconductor element is often required to be sealed without a gross leak. A container to which a lid is to be attached to form a sealed space for sealing a power semiconductor element is also referred to as a package in the present application. The package has a cavity, and the sealed space is obtained by sealing the cavity with the lid.

According to technology disclosed in Japanese Patent Application Laid-Open No. 2005-150133, a heat sink plate, a ceramic frame, and an external connection terminal are first connected to one another. A package having a cavity is thereby prepared. The heat sink plate is made of a composite material. As the composite material, a Cu—W-based composite metal plate, a Cu—Mo-based composite metal plate, and a clad composite metal plate including a Cu—Mo-based alloy metal plate and Cu plates applied to opposite surfaces of the Cu—Mo-based alloy metal plate are given as examples. The heat sink plate and the ceramic frame are joined by Ag—Cu brazing at approximately 780° C. to 900° C. A high frequency semiconductor element is mounted on the package. A lid is adhered to a top surface portion of the ceramic frame to seal the cavity. In other words, the high frequency semiconductor element is hermetically sealed in a sealed space.

A use of the composite material as a material for the heat sink plate as described above can bring the coefficient of thermal expansion of the heat sink plate closer to that of the ceramic frame and that of the semiconductor element. Rupture due to a difference in thermal expansion and contraction can thus be prevented. This allows for joining of the ceramic frame and the semiconductor element to the heat sink plate at a high temperature. In the above-mentioned technology, the heat sink plate and the ceramic frame have already been joined to each other when the semiconductor element is mounted. To mount the semiconductor element not to impair the joining, there is a restriction that the semiconductor element should be mounted at a temperature lower than a temperature at which the ceramic frame is joined. In the above technology, the ceramic frame is joined at a high temperature of approximately 780° C. to 900° C., and thus the joining is little adversely affected by heating at about the temperature at which the semiconductor element is mounted. Furthermore, the coefficient of thermal expansion of the heat sink plate is close to that of the semiconductor element, so that rupture of the semiconductor element due to thermal stress at mounting can be avoided even if the mounting temperature is high to some extent. The semiconductor element can thus be mounted by brazing, for example, at approximately 400° C., which is a relatively high temperature as the mounting temperature.

According to technology disclosed in Japanese Patent Application Laid-Open No. 2003-282751, a Cu or Cu-based metal plate is used as a heat sink plate. Cu is an excellent material in terms of being capable of having a high thermal conductivity of more than 300 W/m·K while being relatively inexpensive. In contrast to the above-mentioned technology disclosed in Japanese Patent Application Laid-Open No. 2005-150133 in which the heat sink plate is made of the composite material, the heat sink plate having a high thermal conductivity can be obtained at a low cost. According to the technology, a semiconductor element is first mounted on the heat sink plate by brazing. Next, a frame to which an external connection terminal is joined in advance is joined to the heat sink plate to surround the semiconductor element. By using a low melting point joining material for the joining, the frame is joined at a temperature lower than a temperature at which the semiconductor element is brazed. Next, a lid is joined to a side of a top surface of the frame to weal a cavity. In other words, the semiconductor element is hermetically sealed in a sealed space. A high frequency power module is thereby obtained.

Japanese Patent Application Laid-Open No. 2012-49224 discloses a method for manufacturing a mounting structure. According to the manufacturing method, a heat dissipation substrate having a mounting region for an electronic component is prepared. A ceramic frame is joined, through a thermosetting resin, to the heat dissipation substrate to surround the mounting region. The electronic component is joined, through a low melting point alloy, to the mounting region at a temperature lower than a temperature at which the thermosetting resin is pyrolyzed. The heat dissipation substrate is made of a metallic material, such as copper, iron, tungsten, molybdenum, nickel, and cobalt, an alloy containing such metallic materials, or a composite material thereof, for example, and has a thermal conductivity of 15 W/m·K or more and 450 W/m·K or less, for example. The thermosetting resin has a lower thermal conductivity than the low melting point alloy. According to description of the document, heat having been transferred to the heat dissipation substrate is less likely to be transferred to the thermosetting resin, so that the thermosetting resin is less likely to be thermally expanded, and the occurrence of cracking of the thermosetting resin can be suppressed. According to description of the document, separation between the ceramic frame and the heat dissipation substrate can consequently effectively be suppressed to maintain good hermeticity in the region surrounded by the ceramic frame.

According to the above-mentioned technology disclosed in Japanese Patent Application Laid-Open No. 2003-282751, the cavity of the package is formed by joining the frame to the heat sink plate after mounting of the semiconductor element. A process after mounting of the semiconductor element is thus complicated in this technology compared with the above-mentioned technology disclosed in Japanese Patent Application Laid-Open No. 2005-150133. This interferes with prompt completion of a semiconductor module after mounting of the semiconductor element. This is not desirable for manufacturers of the semiconductor module. Furthermore, the semiconductor module including the package is often thermally expanded and contracted when being in use. Thus, not only prompt completion of a power semiconductor module after mounting of a power semiconductor element but also prevention of the occurrence of a gross leak due to damage caused by the difference in thermal expansion and contraction when the power semiconductor module is in use are desired. According to the above-mentioned technology disclosed in Japanese Patent Application Laid-Open No. 2012-49224, the frame and the heat dissipation substrate (heat sink plate) are likely to have a large difference in coefficient of thermal expansion because the frame is made of ceramic. The large difference in coefficient of thermal expansion can cause large thermal stress. Even if thermal stress in mounting the semiconductor element does not cause hermeticity deterioration, hermeticity is likely to be deteriorated in actual use thereafter due to thermal stress under repeated temperature changes resulting from external environmental changes and the like.

SUMMARY

The present invention has been conceived to solve a problem as described above, and it is an object of the present invention to provide a package and a method for manufacturing a power semiconductor module which allow prompt completion of a power semiconductor module after mounting of a power semiconductor element and allow suppression of hermeticity deterioration caused by repeated temperature changes made to the package.

A package according to one aspect of the present invention is a package to which a lid is to be attached to form a sealed space for sealing a power semiconductor element without a gross leak, and which includes an external terminal electrode, a frame, a heat sink plate, and an adhesive layer. The external terminal electrode is attached to the frame, and the frame contains a first resin and has a first adhered surface. The heat sink plate supports the frame, has an unmounted region where the power semiconductor element is to be mounted within the frame in plan view, is made of metal, and has a second adhered surface. The adhesive layer contains a second resin different from the first resin, and adheres the first adhered surface of the frame and the second adhered surface of the heat sink plate to each other. One of the first and second adhered surfaces includes a flat portion and a protruding portion. The protruding portion protrudes from the flat portion and opposes the other one of the first and second adhered surfaces with the adhesive layer therebetween.

A package according to another aspect of the present invention is a package to which a lid is to be attached to form a sealed space for sealing a power semiconductor element without a gross leak, and which includes an external terminal electrode, a frame, a heat sink plate, an adhesive layer, and an insert member. The external terminal electrode is attached to the frame, and the frame contains a first resin and has a first adhered surface. The heat sink plate supports the frame, has an unmounted region where the power semiconductor element is to be mounted within the frame in plan view, is made of metal, and has a second adhered surface. The adhesive layer contains a second resin different from the first resin, and adheres the first adhered surface of the frame and the second adhered surface of the heat sink plate to each other. The insert member is disposed within the adhesive layer.

A method for manufacturing a power semiconductor module according to one aspect of the present invention includes the following process. A package is prepared. The package includes an external terminal electrode, a frame, a heat sink plate, and an adhesive layer. The external terminal electrode is attached to the frame, and the frame contains a first resin and has a first adhered surface. The heat sink plate supports the frame, has an unmounted region within the frame in plan view, is made of metal, and has a second adhered surface. The adhesive layer contains a second resin different from the first resin, and adheres the first adhered surface of the frame and the second adhered surface of the heat sink plate to each other. One of the first and second adhered surfaces includes a flat portion and a protruding portion. The protruding portion protrudes from the flat portion and opposes the other one of the first and second adhered surfaces with the adhesive layer therebetween. A power semiconductor element is then mounted on the unmounted region of the heat sink plate. A lid is then attached to the frame to seal the power semiconductor element without a gross leak.

A method for manufacturing a power semiconductor module according to another aspect of the present invention includes the following process. A package is prepared. The package includes an external terminal electrode, a frame, a heat sink plate, an adhesive layer, and an insert member. The external terminal electrode is attached to the frame, and the frame contains a first resin and has a first adhered surface. The heat sink plate supports the frame, has an unmounted region within the frame in plan view, is made of metal, and has a second adhered surface. The adhesive layer contains a second resin different from the first resin, and adheres the first adhered surface of the frame and the second adhered surface of the heat sink plate to each other. The insert member is disposed within the adhesive layer. The power semiconductor element is then mounted on the unmounted region of the heat sink plate. A lid is then attached to the frame to seal the power semiconductor element without a gross leak.

According to the package according to the one aspect of the present invention, one of the first and second adhered surfaces includes the flat portion and the protruding portion. The protruding portion protrudes from the flat portion and opposes the other one of the first and second adhered surfaces with the adhesive layer therebetween. The adhesive layer can thus have a larger thickness on the flat portion than on the protruding portion. The adhesive layer can thus easily and surely have a sufficiently thick portion. The sufficiently thick portion is elastically deformed to relieve stress caused by a difference in thermal expansion between the frame and the heat sink plate. Hermeticity deterioration caused by repeated temperature changes made to the package can thereby be suppressed.

According to the package according to the other aspect of the present invention, the insert member is disposed within the adhesive layer adhering the first adhered surface of the frame and the second adhered surface of the heat sink plate to each other. The adhesive layer can thus have a larger thickness between the first and second adhered surfaces offset from the insert member than between the insert member and each of the first and second adhered surfaces. The adhesive layer can thus easily and surely have a sufficiently thick portion. The sufficiently thick portion is elastically deformed to relieve stress caused by a difference in thermal expansion between the frame and the heat sink plate. Hermeticity deterioration caused by repeated temperature changes made to the package can thereby be suppressed.

According to the method for manufacturing the power semiconductor module according to the one aspect of the present invention, after formation of the adhesive layer adhering the frame and the heat sink plate to each other, the power semiconductor element is mounted on the heat sink plate. Heating is required for the mounting, and thus the temperature of the adhesive layer increases. If the adhesive layer does not have a sufficiently thick portion, an effect of relieving, by the adhesive layer, stress caused by a difference in thermal expansion between the frame and the heat sink plate is likely to be small. As a result, hermeticity deterioration is likely to be caused by repeated temperature changes made to the package. To address the problem, according to the method for manufacturing the power semiconductor module according to the one aspect of the present invention, one of the first and second adhered surfaces includes the flat portion and the protruding portion. The protruding portion protrudes from the flat portion and opposes the other one of the first and second adhered surfaces with the adhesive layer therebetween. The adhesive layer can thus have a larger thickness on the flat portion than on the protruding portion. The adhesive layer can thus easily and surely have a sufficiently thick portion. The sufficiently thick portion is elastically deformed to relieve stress caused by the difference in thermal expansion between the frame and the heat sink plate. Hermeticity deterioration caused by the repeated temperature changes made to the package can thereby be suppressed.

According to the method for manufacturing the power semiconductor module according to the other aspect of the present invention, after formation of the adhesive layer adhering the frame and the heat sink plate to each other, the power semiconductor element is mounted on the heat sink plate. Heating is required for the mounting, and thus the temperature of the adhesive layer increases. If the adhesive layer does not have a sufficiently thick portion, an effect of relieving, by the adhesive layer, stress caused by a difference in thermal expansion between the frame and the heat sink plate is likely to be small. As a result, hermeticity deterioration is likely to be caused by repeated temperature changes made to the package. To address the problem, according to the method for manufacturing the power semiconductor module according to the other aspect of the present invention, the insert member is disposed within the adhesive layer adhering the first adhered surface of the frame and the second adhered surface of the heat sink plate to each other. The adhesive layer can thus have a larger thickness between the first adhered surface and the second adhered surface offset from the insert member than between the insert member and each of the first adhered surface and the second adhered surface. The adhesive layer can thus easily and surely have a sufficiently thick portion. The sufficiently thick portion is elastically deformed to relieve stress caused by the difference in thermal expansion between the frame and the heat sink plate. Hermeticity deterioration caused by the repeated temperature changes made to the package can thereby be suppressed.

These and other objects, features, aspects and advantages of the present invention will become more apparent from the following detailed description when taken in conjunction with the accompanying drawings.

BRIEF DESCRIPTION OF THE DRAWINGS

FIG. 4 is a schematic cross-sectional view taken along the line IV-IV of FIG. 3.

DESCRIPTION OF THE PREFERRED EMBODIMENTS

Figure 1:
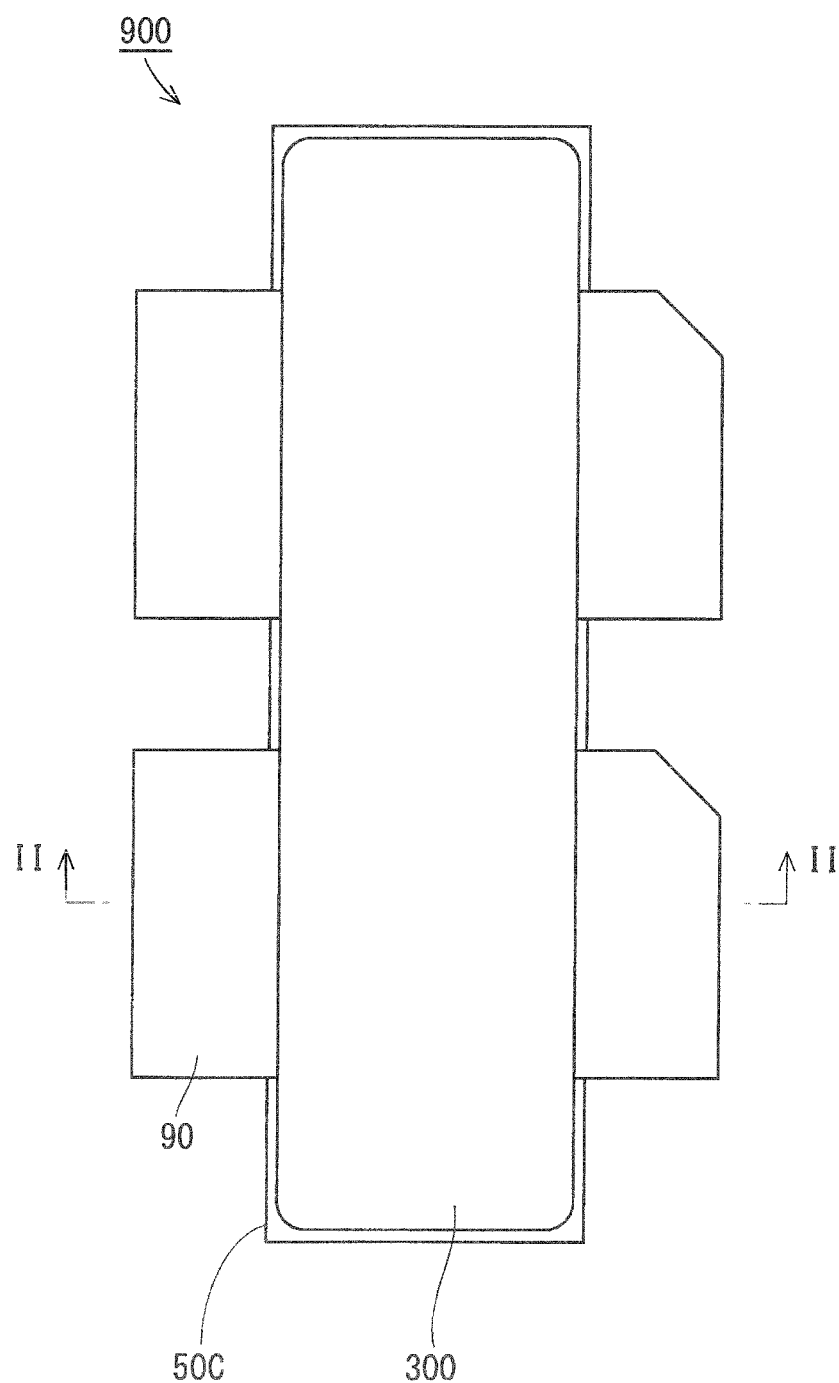
FIG. 1 is a top view schematically showing a configuration of a power semiconductor module in Embodiment 1 of the present invention.

Embodiments of the present invention will be described below with reference to the drawings. The same or corresponding components bear the same reference signs in the drawings below, and description thereof will not be repeated.

Embodiment 1

Figure 2:
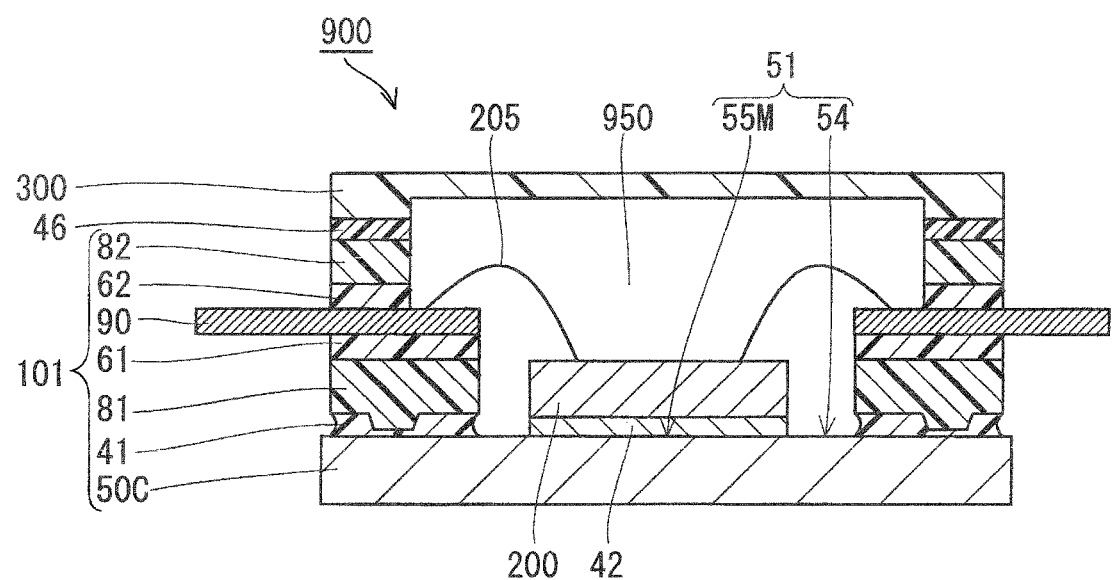
FIG. 2 is a schematic cross-sectional view taken along the line II-II of FIG. 1.

FIG. 1 is a top view schematically showing a configuration of a power semiconductor module 900 in Embodiment 1. FIG. 2 is a schematic cross-sectional view taken along the line II-II of FIG. 1. The power semiconductor module 900 includes a package 101, a power semiconductor element 200, and a lid 300. The power semiconductor module 900 also includes an adhesive layer 46 and a joining layer 42.

The power semiconductor element 200 may be a high frequency semiconductor element. The high frequency semiconductor element is a semiconductor element operating at a frequency of approximately several tens of megahertz (e.g., 30 MHz) or more and 30 GHz or less. In this case, the power semiconductor module 900 is a high frequency module. The power semiconductor element 200 suitable for high frequency applications is typically a lateral diffused MOS (LDMOS) transistor or a gallium nitride (GaN) transistor.

The power semiconductor element 200 is disposed on a mounted region 55M of a heat sink plate 50C of the package 101. It is preferable that the mounted region 55M and the power semiconductor element 200 be joined to each other through the joining layer 42 containing a thermosetting resin and a metal. The thermosetting resin of the joining layer 42 preferably includes an epoxy resin. The metal of the joining layer 42 preferably includes silver.

The package 101 includes the heat sink plate 50C and a frame 81, which will be described in details below. The heat sink plate 50C has the mounted region 55M within the frame 81 in plan view. In other words, the heat sink plate 50C has the mounted region 55M surrounded by the frame 81 in plan view. The power semiconductor element 200 is mounted on the mounted region 55M of the heat sink plate 50C.

The lid 300 is attached to the package 101. Specifically, the adhesive layer 46 adheres the package 101 and the lid 300 to each other. A sealed space 950 for sealing the power semiconductor element 200 without a gross leak is thereby formed. The power semiconductor element 200 is thus highly hermetically protected against an external environment to prevent ingress of water vapor and other gases in the atmosphere. It is preferable that the sealed space 950 be environmentally resistant to 500 cycles of a temperature change between −65° C. and +150° C. Specifically, the sealed space 950 preferably has no gross leak even after subjected to the above-mentioned temperature change.

Figure 3:
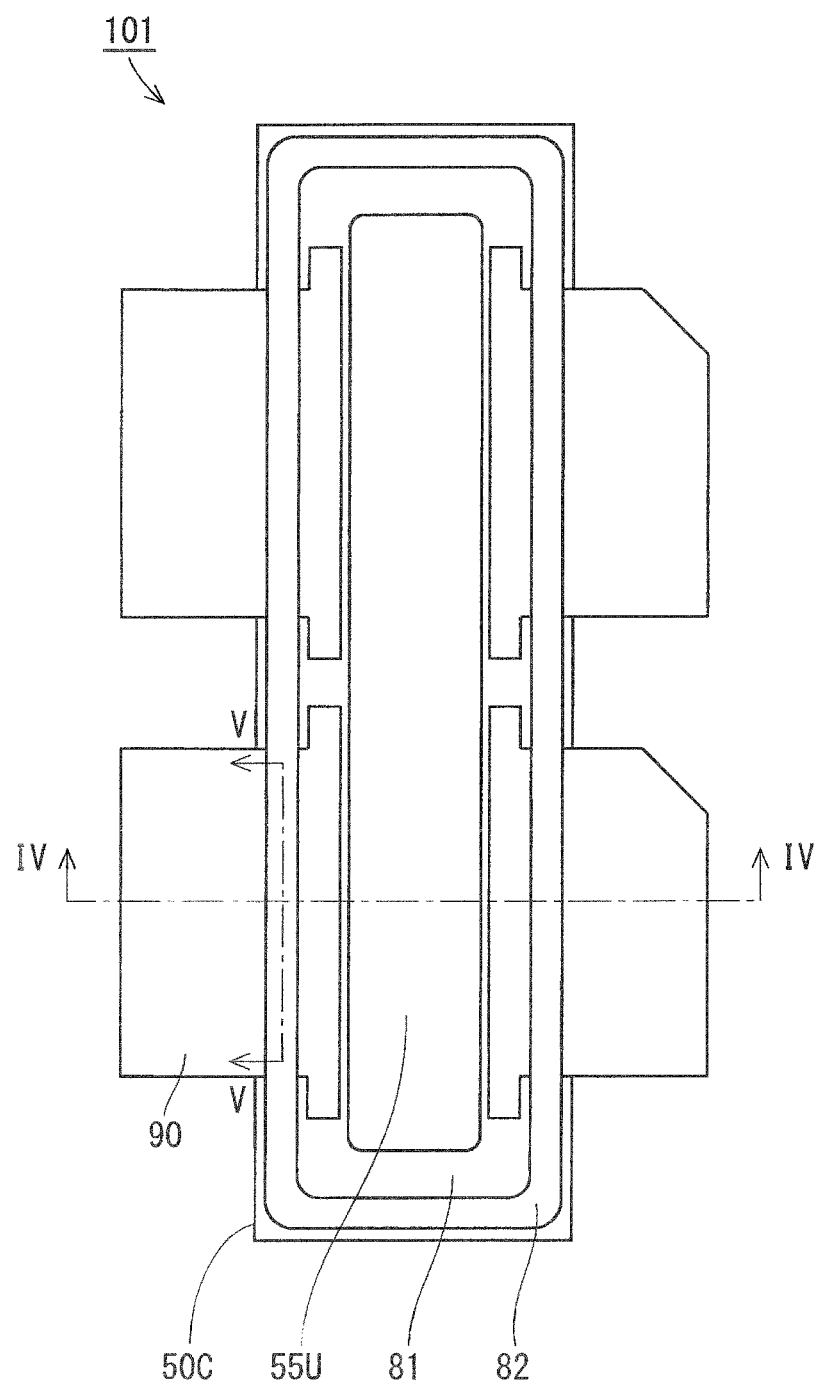
FIG. 3 is a top view schematically showing a configuration of a package in Embodiment 1 of the present invention.
Figure 5:
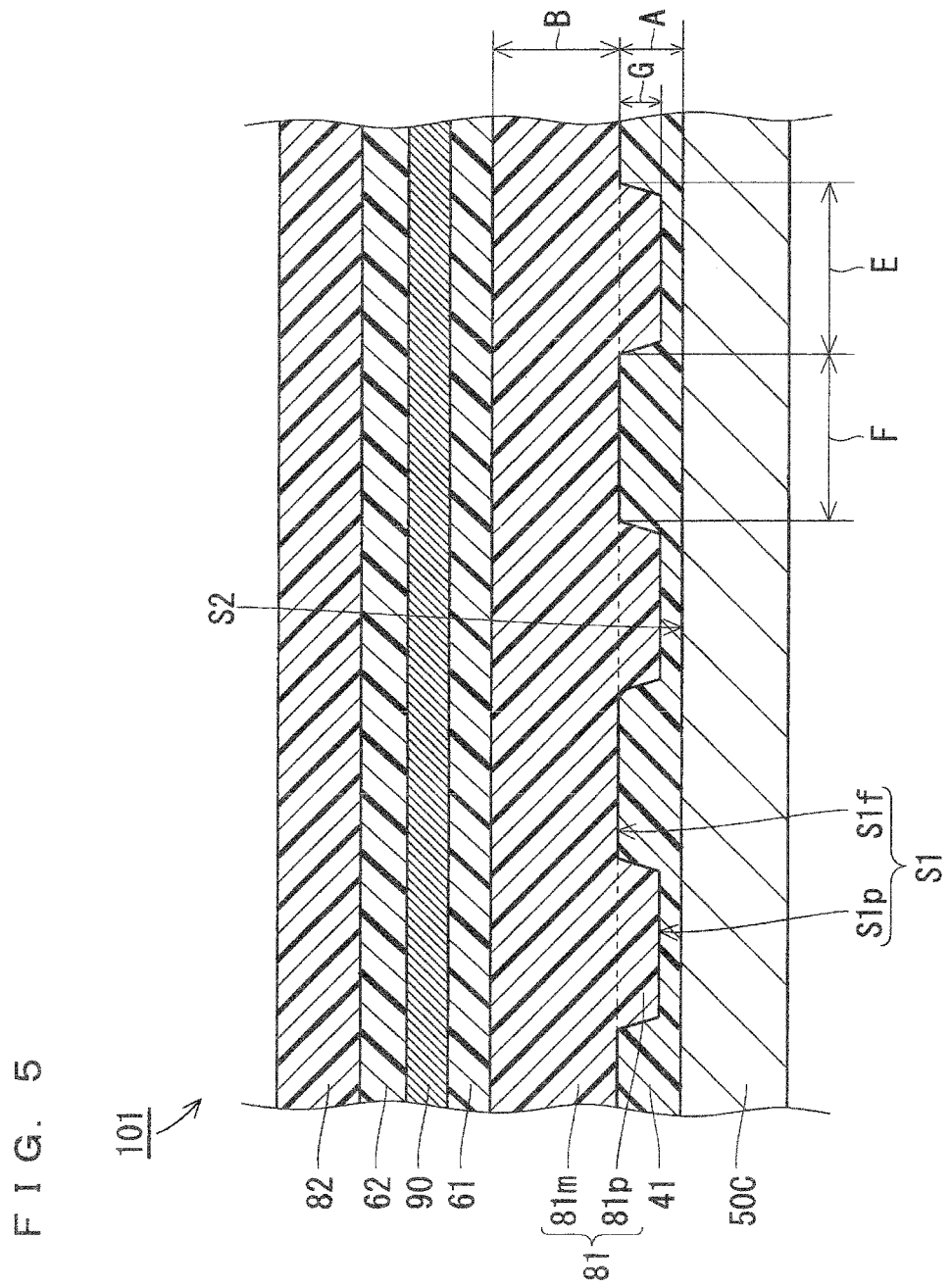
FIG. 5 is a schematic partial cross-sectional view taken along the line V-V of FIG. 3.
Figure 6:
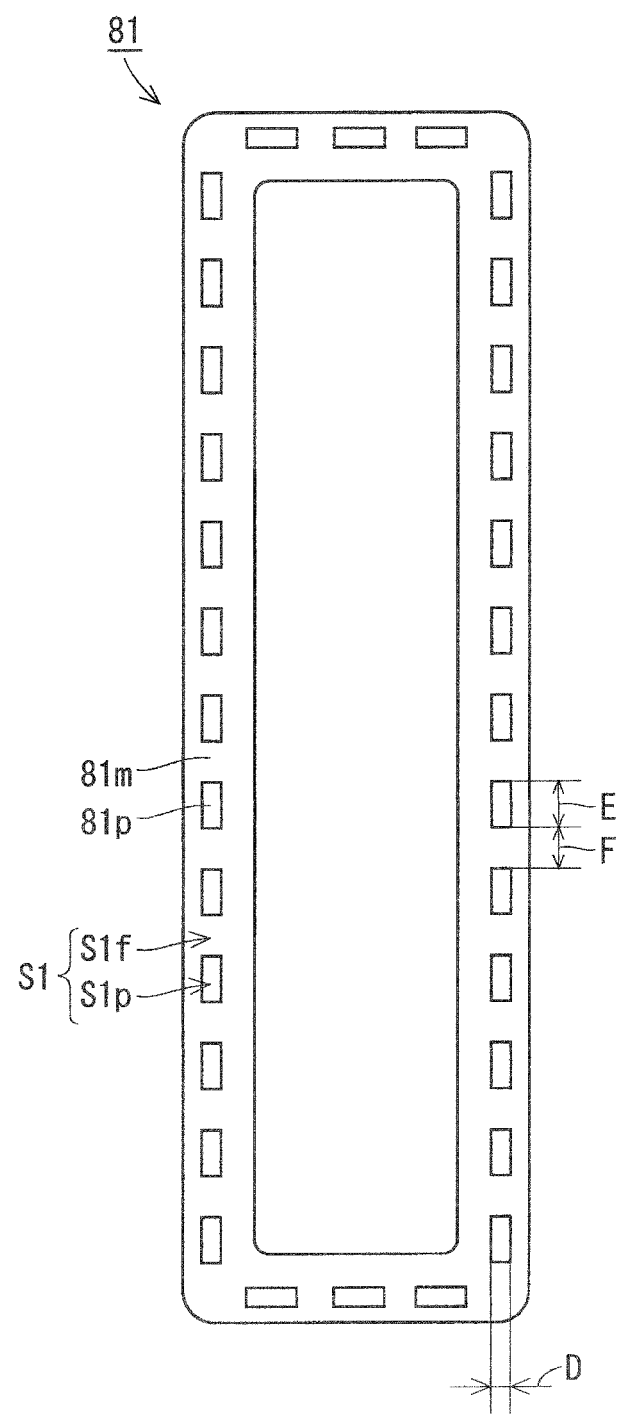
FIG. 6 is a bottom view schematically showing a configuration of a frame in Embodiment 1 of the present invention.

FIG. 3 is a top view schematically showing a configuration of the package 101 in Embodiment 1. FIG. 4 and FIG. 5 are schematic partial cross-sectional views respectively taken along the line IV-IV and the line V-V of FIG. 3. FIG. 6 is a bottom view schematically showing a configuration of the frame 81 (FIGS. 4 and 5). The package 101 is to be used for the manufacture of the power semiconductor module 900 (FIGS. 1 and 2). The lid 300 (FIGS. 1 and 2) is to be attached to the package 101 to form the sealed space 950 (FIG. 2). The power semiconductor element 200 is sealed without a gross leak in the sealed space 950. The package 101 has, on the heat sink plate 50C, a space surrounded by the frame 81 as a cavity to become the sealed space 950. Specifically, the package 101 includes an external terminal electrode 90, the frame 81, the heat sink plate 50C, and an adhesive layer 41. The package 101 may further include an electrode adhesive layer 61, an electrode adhesive layer 62, and an upper frame 82, and, in this case, the package 101 may be sealed by the lid 300 being attached to the upper frame 82 through the adhesive layer 46. Alternatively, the electrode adhesive layer 62 and the upper frame 82 may be omitted, and, in this case, the package 101 may be sealed by the lid 300 being attached to the external terminal electrode 90 attached to the frame 81 and an exposed surface of the electrode adhesive layer 61 through the adhesive layer 46. Furthermore, in a case where the electrode adhesive layer 61 is provided only between the external terminal electrode 90 and the frame 81, the package 101 may be sealed by the lid 300 being attached to the external terminal electrode 90 attached to the frame 81 and an exposed surface of the frame 81 through the adhesive layer 46.

The frame 81 contains a resin (first resin). The resin is preferably a thermoplastic resin. An inorganic filler (a first inorganic filler) is preferably dispersed in the resin. The inorganic filler preferably includes at least fibrous particles or plate-like particles. Due to the fibrous or plate-like shape, inhibition of flow of the resin by the filler is suppressed when the frame 81 is formed by injection molding technology and the like. Examples of a material for such an inorganic filler include silica glass fibers, alumina fibers, carbon fibers, talc (3MgO.4SiO$_2$.H$_2$O), wollastonite, mica, graphite, calcium carbonate, dolomite, glass flakes, glass beads, barium sulfate, and titanium oxide. An inorganic filler made of talc has a particle diameter of 1 m to 50 μm on a flat plate, for example. The particle diameter is herein an arithmetical mean value of a longer diameter obtained by observation of a cross section of the resin. An inorganic filler content is preferably 30 wt % to 70 wt %. In a case where the coefficient of thermal expansion of the heat sink plate 50C is the same as or close to that of copper, the coefficient of thermal expansion of the inorganic filler is preferably 17 ppm/K or less in view of the coefficient of thermal expansion of copper. A material for the frame 81 is preferably heat resistant to heat treatment at 260° C. for two hours. In a case where the package 101 is heat resistant to heat treatment at 260° C. for two hours, the package 101 can withstand typical heat treatment in a process of mounting the power semiconductor element 200 (FIG. 2) using a pasty adhesive containing the thermosetting resin and the metal.

The external terminal electrode 90 is attached to the frame 81. In the present embodiment, the electrode adhesive layer 61 and the electrode adhesive layer 62 are used for the attachment. In a modification, the external terminal electrode 90 may directly be attached to the frame 81. In other words, the external terminal electrode 90 made of metal and the frame 81 and the upper frame 82 each made of resin may integrally be molded. The external terminal electrode 90 is made of metal, and preferably contains copper at a purity of 90 wt % (weight percent) or more. In place of such a material containing copper at a high purity, Kovar®, an iron-nickel alloy, or the like may be used. The surface of the external terminal electrode 90 may be nickel-plated or nickel-plated and then gold-plated to secure joining to a bonding wire 205 (FIG. 2) and the like.

The heat sink plate 50C supports the frame 81. The heat sink plate 50C has an inner surface 51 surrounded by the frame 81 in plan view. The inner surface 51 has an unmounted region 55U (FIG. 4) where the power semiconductor element 200 (FIG. 2) is to be mounted. The unmounted region 55U is a region where the power semiconductor element 200 is to be mounted while the power semiconductor element 200 has not yet been mounted. In other words, a portion of the inner surface 51 of the package 101 that becomes the mounted region 55M (FIG. 2) by being mounted by the power semiconductor element 200 is the unmounted region 55U (FIG. 4). The unmounted region 55U is preferably exposed. The inner surface 51 may also have a peripheral region 54 where the power semiconductor element 200 is not to be mounted. The heat sink plate 50C has an outer surface (a lower surface in FIG. 4) opposite the inner surface 51. The outer surface is usually attached to another member when the power semiconductor module 900 (FIG. 2) is in use, but may be exposed in the manufacture of the power semiconductor module 900.

The heat sink plate 50C is made of metal. The metal is preferably a non-composite material containing copper at a purity of 95.0 wt % or more, and is more preferably a non-composite material containing copper at a purity of 99.8 wt % or more. A plated layer, such as a nickel layer and a gold layer, may be added to the heat sink plate containing copper as a main component as described above.

The adhesive layer 41 adheres an adhered surface S1 (a first adhered surface) of the frame 81 and an adhered surface S2 (a second adhered surface) of the heat sink plate 50C to each other. The adhesive layer 41 secures hermeticity between the heat sink plate 50C and the frame 81. The hermeticity between the heat sink plate 50C and the frame 81 is preferably heat resistant to heat treatment at 260° C. for two hours. A test to determine whether the hermeticity between the heat sink plate 50C and the frame 81 is heat resistant to heat treatment at 260° C. for two hours may be conducted by conducting, after the package 101 (FIG. 4) is subjected to heat treatment at 260° C. for two hours, a gross leak test on the package 101 to which the lid 300 (FIG. 2) has sufficiently hermetically been attached. In a case where the lid 300 and a structure to attach the lid 300 are sufficiently heat resistant, the lid 300 may be attached before heat treatment.

The adhesive layer 41 preferably has a concave side surface connecting the heat sink plate 50C and the frame 81 as illustrated in FIG. 4. The concave shape can be formed by surface tension of a fluid layer to become the adhesive layer 41 by being cured. The concave shape, however, is lost as the fluid layer is pressed. To obtain the adhesive layer 41 having the concave side surface, it is desirable not to press the fluid layer too hard.

The adhesive layer 41 is made of a material different from the material for the frame 81. The adhesive layer 41 contains a resin (second resin) different from the resin of the frame 81 (first resin). The resin of the adhesive layer 41 is preferably a thermosetting resin in terms of heat resistance and high fluidity before curing, and is an epoxy resin, for example.

An inorganic filler is preferably dispersed in the resin of the adhesive layer 41. The inorganic filler preferably contains at least silica glass or crystalline silica, and is more preferably made of silica glass. Silica glass and crystalline silica typically have a coefficient of thermal expansion of approximately 0.5 ppm/K and a coefficient of thermal expansion of approximately 15 ppm/K, respectively, and thus the inorganic filler can have a coefficient of thermal expansion of 17 ppm/K or less. This is particularly desirable in a case where an epoxy resin or a fluororesin is used as the resin of the adhesive layer 41. In this case, an inorganic filler content is preferably 50 wt % to 90 wt %. In place of or together with at least silica glass or crystalline silica, at least any of alumina, aluminum hydroxide, talc, iron oxide, wollastonite, calcium carbonate, mica, titanium oxide, and carbon fibers may be used. The inorganic filler has a spherical, fibrous, or plate-like shape, for example. On the other hand, in a case where a silicone resin is used as the resin of the adhesive layer 41, a restriction of the coefficient of thermal expansion of the inorganic filler is substantially negligible as the silicone resin has rubber elasticity. In this case, an inorganic filler content may be adjusted in terms of control of fluidity of the adhesive layer 41 and the like, and is preferably 1 wt % to 10 wt %. Spherical silica glass (non-crystalline silica) having a particle diameter of 1 μm to 50 μm is optimal in terms of securement of fluidity of the adhesive layer 41 before curing.

One of the adhered surface S1 of the frame 81 and the adhered surface S2 of the heat sink plate 50C includes a flat portion and a protruding portion protruding from the flat portion and opposing the other one of the adhered surface S1 and the adhered surface S2 with the adhesive layer 41 therebetween. In the present embodiment, the adhered surface S1 includes a flat portion S1$f$ and a protruding portion S1$p$ protruding from the flat portion S1$f$ and opposing the adhered surface S2 with the adhesive layer 41 therebetween. In other words, the frame 81 includes a major portion 81$m$ having a flat bottom surface and a minor portion 81$p$ disposed to protrude from the bottom surface. A height G (FIG. 5) of the protruding portion S1$p$ is preferably 0.02 mm or more, and is more preferably 0.05 mm or more. In the present embodiment, the adhered surface S2 is flat. In the present embodiment, the protruding portion S1$p$ is tapered in a direction in which the protruding portion S1$p$ is protruding, that is, downward in FIG. 5.

A method for manufacturing the power semiconductor module 900 (FIG. 2) will be described next. The package 101 (FIG. 4) is prepared first.

The power semiconductor element 200 is then mounted on the unmounted region 55U of the heat sink plate 50C. The exposed unmounted region 55U (FIG. 4) thus becomes the mounted region 55M (FIG. 2) covered with the power semiconductor element 200. It is preferable that, when the power semiconductor element 200 is mounted, the unmounted region 55U of the heat sink plate 50C and the power semiconductor element 200 be joined to each other through the joining layer 42 containing the thermosetting resin and the metal. In other words, it is preferable that the joining be performed by application and curing of the pasty adhesive containing the thermosetting resin and the metal. The thermosetting resin of the joining layer 42 preferably includes an epoxy resin. The metal of the joining layer 42 preferably includes silver.

The power semiconductor element 200 and the external terminal electrode 90 are then connected by the bonding wire 205 (FIG. 2) in the cavity of the package 101. Electrical connection between the power semiconductor element 200 and the external terminal electrode 90 is thereby secured. Electrical connection between the power semiconductor element 200 and the external terminal electrode 90 may be secured by a method other than the method using the bonding wire 205, and, in this case, the bonding wire 205 is not necessarily required.

The lid 300 is then attached to the package 101 to seal the power semiconductor element 200 without a gross leak. The power semiconductor module 900 is thereby obtained. Specifically, the upper frame 82 and the lid 300 are adhered to each other by the adhesive layer 46. The lid 300 is attached to the package 101 so as not to thermally damage the package 101 on which the power semiconductor element 200 has been mounted to such a degree that a gross leak is caused. In other words, the lid 300 is attached to the package 101 so as not to thermally damage the adhesive layer 41 to such a degree that a gross leak is caused. For example, the lid 300 is attached to the package 101 through the adhesive layer 46 cured at a curing temperature low enough not to lead to the above-mentioned thermal damage. The curing temperature is less than 260° C., for example.

Figure 7:
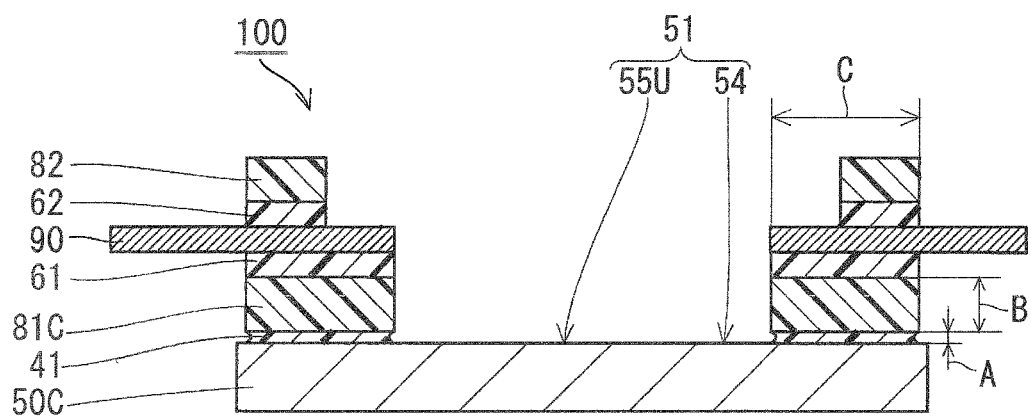
FIG. 7 is a cross-sectional view showing a configuration of a package in a comparative example in a view corresponding to FIG. 4.

FIG. 7 is a cross-sectional view showing a configuration of a package 100 in a comparative example in a view corresponding to FIG. 4 (the package 101 in the present embodiment). In contrast to the frame 81 (FIG. 5), a frame 81C of the package 100 does not include the minor portion 81$p$, and thus does not include the protruding portion S1$p$. In this case, the adhesive layer 41 has a substantially uniform thickness between the frame 81C and the heat sink plate 50C, and there is usually a limit on a stable increase of the thickness. If a large quantity of adhesive is simply applied, bleeding, that is, a phenomenon of flow of the adhesive to the unmounted region 55U occurs to affect the mounting process. Furthermore, the thickness of the adhesive layer 41 can greatly vary depending on a condition of a load put on the adhesive. On the other hand, if the thickness is insufficient, an effect of relieving, due to elastic deformation of the adhesive layer 41, stress caused by a difference in thermal expansion between the frame 81C and the heat sink plate 50C is small. As a result, hermeticity deterioration is likely to be caused by repeated temperature changes made to the package 100.

(Effects)

According to the present embodiment, the adhered surface S1 (FIG. 5) includes the flat portion S1$f$ and the protruding portion S1$p$ protruding from the flat portion S1$f$ and opposing the adhered surface S2 with the adhesive layer 41 therebetween. The adhesive layer 41 can thus have a larger thickness between the flat portion S1$f$ of the adhered surface S1 and the adhered surface S2 than between the protruding portion S1$p$ of the adhered surface S1 and the adhered surface S2. The adhesive layer 41 can thus easily and surely have a sufficiently thick portion. The sufficiently thick portion is elastically deformed to relieve stress caused by the difference in thermal expansion between the frame 81 and the heat sink plate 50C. Hermeticity deterioration caused by repeated temperature changes made to the package 101 can thereby be suppressed.

In particular, in a case where the adhesive layer 41 (FIG. 5) contains the filler, a difference between a thickness A and the height G is usually greater than the particle diameter of the filler. The thickness A of the adhesive layer 41 can thus easily be greater than the sum of the particle diameter of the filler and the height G.

As described above, the thickness of the above-mentioned thick portion of the adhesive layer 41 is substantially determined by the shape of the protruding portion S1$p$ and the material for the adhesive layer 41, and little depends on the condition of the load put on the adhesive layer 41 before curing. Variation in thickness of the adhesive layer 41 is thereby suppressed. The stress relieving effect of the adhesive layer 41 can thus stably be obtained.

Formation of the protruding portion on the frame 81 mainly made of resin as in the present embodiment is easier in manufacture than formation of the protruding portion on the heat sink plate 50 made of metal. In particular, in a case where the frame 81 is formed by resin molding, the frame 81 including the protruding portion S1$p$ can easily be obtained only by imparting a shape corresponding to the protruding portion S1$p$ to a mold in advance.

Furthermore, due to the protruding portion S1$p$, the fluid layer to become the adhesive layer 41 is held on the protruding portion S1$p$ by interfacial tension. The fluid layer is thus less likely to flow to the unmounted region 55U. The occurrence of bleeding can thus be suppressed.

The hermeticity between the heat sink plate 50C and the frame 81 is preferably heat resistant to heat treatment at 260° C. for two hours. If a thermal load corresponding to heat treatment at 260° C. for two hours is put when the power semiconductor element 200 is mounted, a gross leak of the sealed space 950 (FIG. 2) can be avoided. Specifically, it is possible to withstand typical heat treatment in the process of mounting the power semiconductor element 200 using the pasty adhesive containing the thermosetting resin and the metal.

The heat sink plate 50C is preferably made of the non-composite material containing copper at a purity of 95.0 wt % or more. A high thermal conductivity of more than 300 W/m·K can thus easily be obtained. For example, a high thermal conductivity of 347 W/m·K can be obtained by using a material (containing copper at a purity of 99.82 wt % or more) set forth in Japanese Industrial Standards (JIS) C 1510. Before mounting of the power semiconductor element 200, the heat sink plate 50C has, within the frame 81, the unmounted region 55U (FIG. 4) where the power semiconductor element 200 is to be mounted. In other words, the frame 81 has already been attached to the heat sink plate 50C when the power semiconductor element 200 is mounted. A process of attaching the frame 81 to the heat sink plate 50C is thus not required after mounting of the power semiconductor element 200. As described above, the power semiconductor module 900 (FIG. 2) can promptly be completed after mounting of the power semiconductor element 200 while the heat sink plate 50C having a high thermal conductivity is used.

The unmounted region 55U (FIG. 4) is preferably exposed. The power semiconductor element 200 (FIG. 2) can thereby easily be mounted on the unmounted region 55U (FIG. 4).

The adhesive layer 41 (FIG. 4) preferably has the concave side surface connecting the heat sink plate 50C and the frame 81. The stress relieving effect of the adhesive layer 41 can thereby be enhanced.

According to the method for manufacturing the power semiconductor module 900 (FIG. 2) in the present embodiment, after formation of the package 101 (FIG. 4), the power semiconductor element 200 is mounted on the heat sink plate 50C of the package 101. Thus, after formation of the adhesive layer 41 adhering the frame 81 and the heat sink plate 50C to each other, the power semiconductor element 200 is mounted on the heat sink plate 50C. Heating is required for the mounting, and thus the temperature of the adhesive layer 41 increases. If the adhesive layer 41 does not have the sufficiently thick portion, the effect of relieving, by the adhesive layer 41, stress caused by the difference in thermal expansion between the frame 81 and the heat sink plate 50C is likely to be small. As a result, hermeticity deterioration is likely to be caused by the repeated temperature changes made to the package 101. In contrast, according to the method for manufacturing the power semiconductor module 900 in the present embodiment, the adhesive layer 41 can have a larger thickness on the flat portion S1$f$ than on the protruding portion S1$p$. The adhesive layer 41 can thus easily and surely have the sufficiently thick portion. The sufficiently thick portion is elastically deformed to relieve stress caused by the difference in thermal expansion between the frame 81 and the heat sink plate 50C. Hermeticity deterioration caused by the repeated temperature changes made to the package 101 can thereby be suppressed.

It is preferable that, when the power semiconductor element 200 is mounted, the unmounted region 55U (FIG. 4) of the heat sink plate 50C and the power semiconductor element 200 be joined to each other through the joining layer 42 (FIG. 2) containing the thermosetting resin and the metal. The joining layer 42 contains the metal to enhance heat dissipation from the power semiconductor element 200 to the heat sink plate 50C. The joining layer 42 contains the resin to relieve thermal stress applied from the heat sink plate 50C to the power semiconductor element 200 through the joining layer 42. Rupture of the power semiconductor element 200 due to thermal stress is thus less likely to occur.

Figure 8:
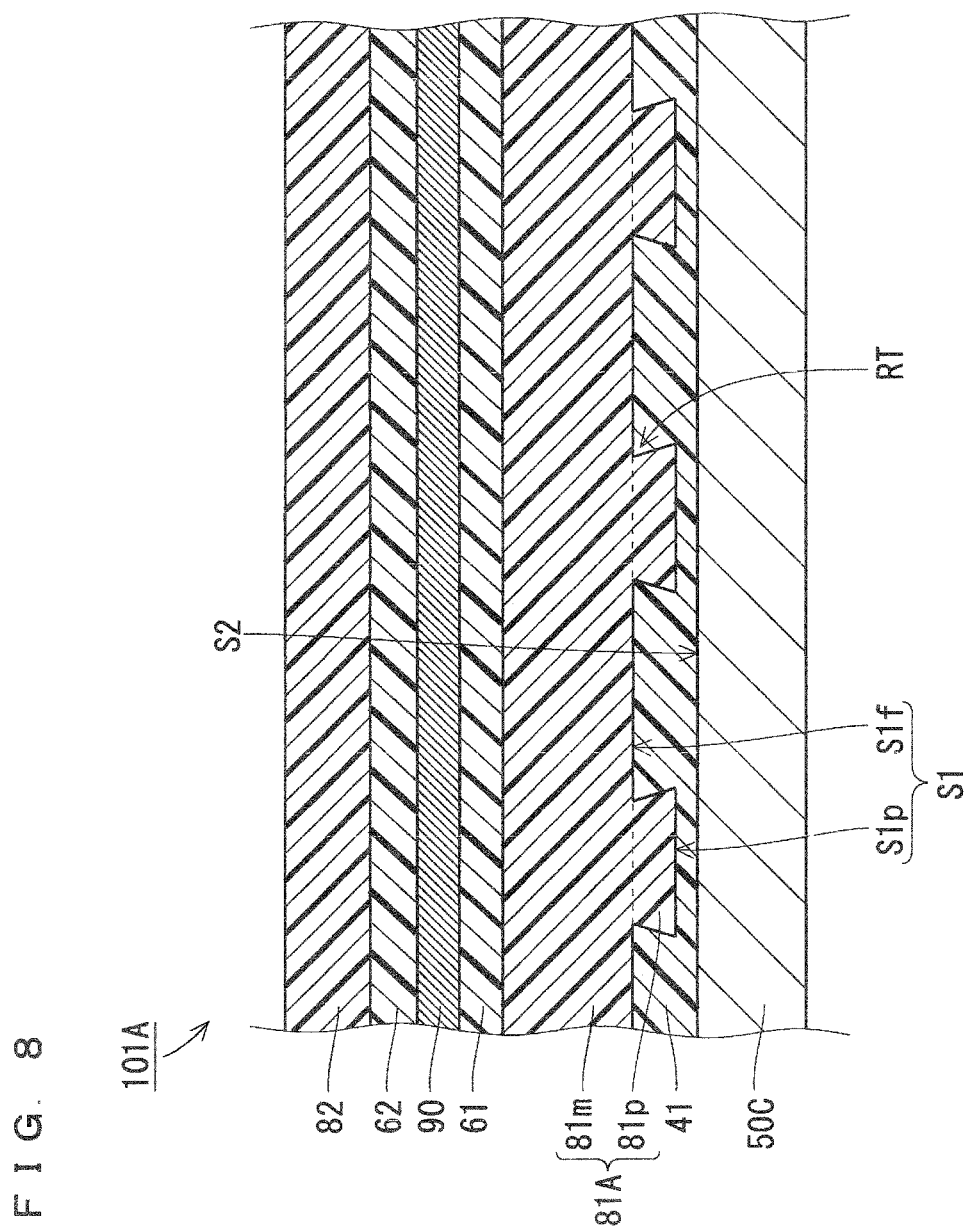
FIG. 8 is a partial cross-sectional view schematically showing a modification of FIG. 5.

FIG. 8 is a partial cross-sectional view schematically showing a package 101A in a modification of FIG. 5 (the package 101). In the present modification, the protruding portion S1$p$ of a frame 81A is not tapered but is reverse-tapered in the direction in which the protruding portion S1$p$ is protruding. An anchoring effect of the protruding portion S1$p$ in the adhesive layer 41 is thereby enhanced. Adhesion between the adhesive layer 41 and the frame 81A can thus be enhanced. On the other hand, bubbles are likely to be trapped at a base of the protruding portion S1$p$ (an arrow RT in FIG. 8) in the present modification. The bubbles are not desirable as they can be a source of a gas. It is preferable to use the frame 81 (FIG. 5) including the tapered protruding portion S1$p$ to suppress generation of the bubbles. The protruding portion S1p may have a shape different from the tapered shape and the reverse-tapered shape.

Figure 9:
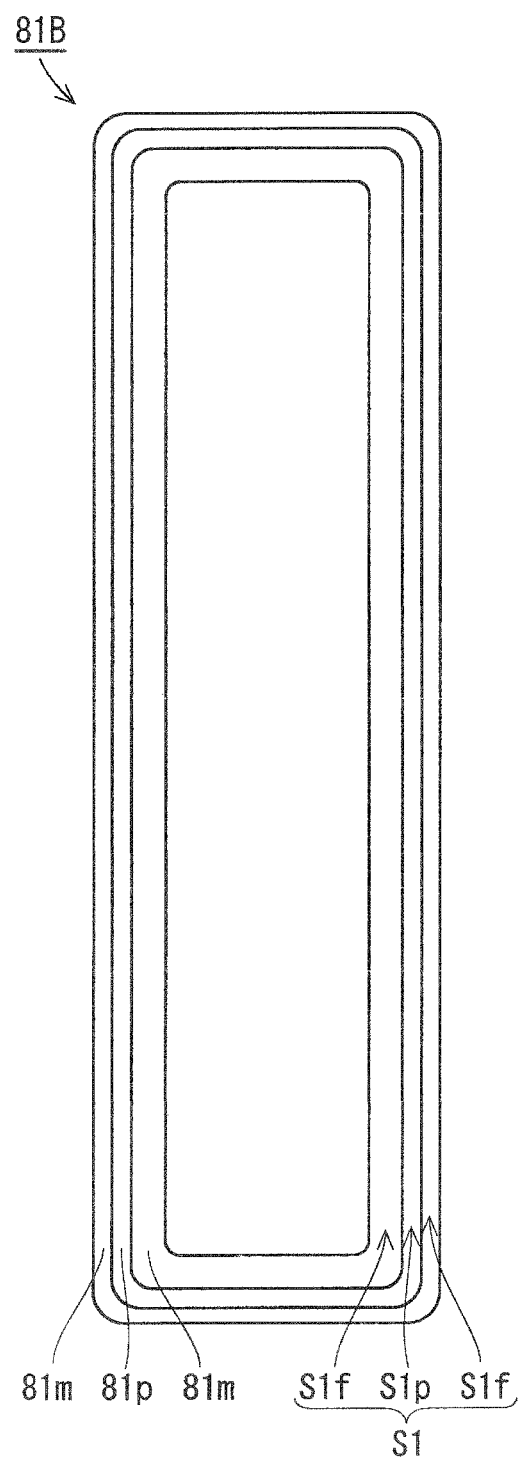
FIG. 9 is a bottom view schematically showing a modification of FIG. 6.

FIG. 9 is a bottom view schematically showing a frame 81B in a modification of FIG. 6 (the frame 81). In the frame 81, the protruding portion S1p has a discrete pattern along the periphery of the frame 81, but, in the frame 81B, the protruding portion S1p has a continuous pattern along the periphery of the frame 81B. According to the present modification, the adhesive layer 41 also includes a relatively thick portion inside or outside the protruding portion S1p, and thus a substantially similar effect to that obtained in the above-mentioned present embodiment can be obtained. In particular, in contract to the above-mentioned present embodiment (FIG. 6), no gap is formed between adjacent protruding portions S1p in the present modification. Embedment in the adhesive layer 41 is thus less likely to be insufficient. A leak due to insufficient embedment can more surely be avoided.

Embodiment 2

Figure 10:
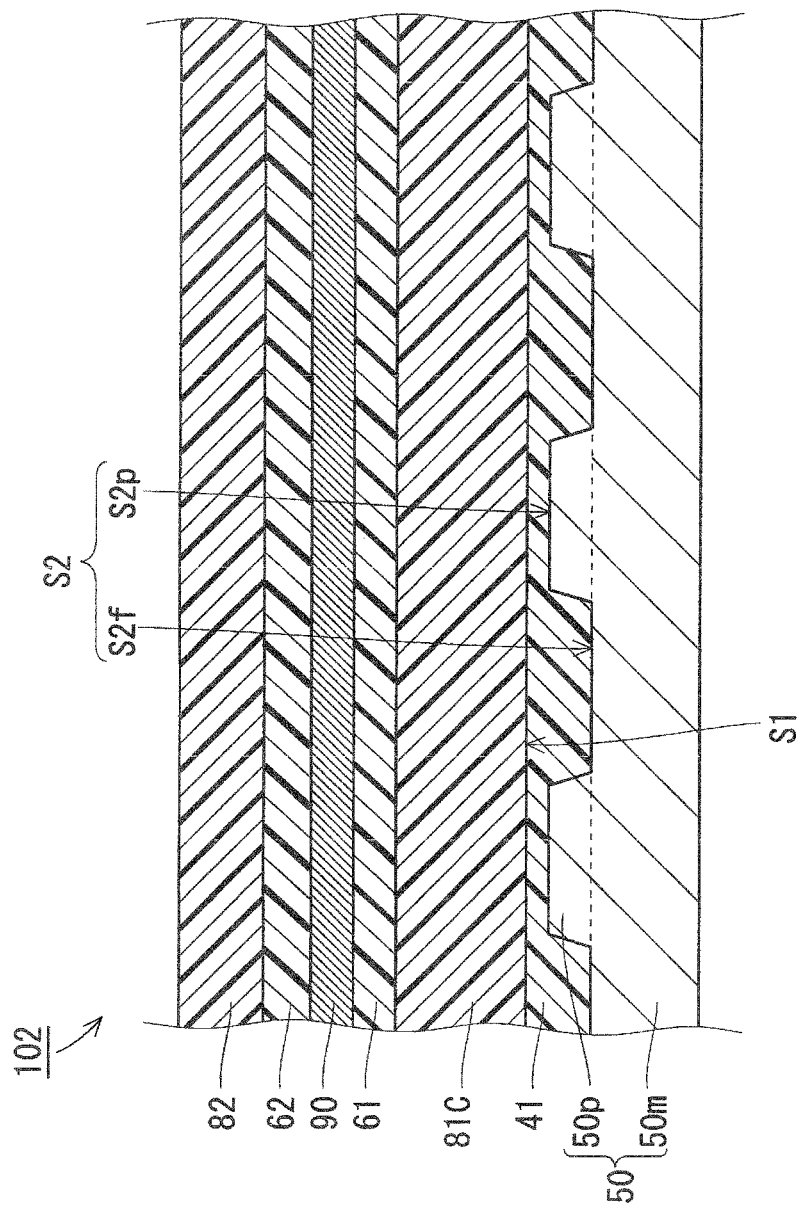
FIG. 10 is a partial cross-sectional view schematically showing a configuration of a package in Embodiment 2 of the present invention.

FIG. 10 is a partial cross-sectional view schematically showing a configuration of a package 102 in Embodiment 2. In place of the heat sink plate 50C and the frame 81 (FIG. 4: Embodiment 1), a heat sink plate 50 and the frame 81C are respectively used in the present embodiment. The adhered surface S2 of the heat sink plate 50 includes a flat portion S2f and a protruding portion S2p protruding from the flat portion S2f and opposing the adhered surface S1 with the adhesive layer 41 therebetween. On the other hand, the adhered surface S1 of the frame 81C is flat. In other words, the heat sink plate 50 includes a major portion 50m having a flat top surface and a minor portion 50p disposed to protrude from the top surface. On the other hand, the frame 81C has a flat bottom surface. In other respects, the heat sink plate 50 is substantially similar to the heat sink plate 50C in Embodiment 1, and the frame 81C is substantially similar to the frame 81 in Embodiment 1.

According to the present embodiment, the adhesive layer 41 can have a larger thickness between the flat portion S2f of the adhered surface S2 and the adhered surface S1 than between the protruding portion S2p of the adhered surface S2 and the adhered surface S1. The adhesive layer 41 can thus easily and surely have a sufficiently thick portion. The sufficiently thick portion is elastically deformed to relieve stress caused by a difference in thermal expansion between the frame 81C and the heat sink plate 50. Hermeticity deterioration caused by repeated temperature changes made to the package 102 can thereby be suppressed.

Embodiment 3

Figure 11:
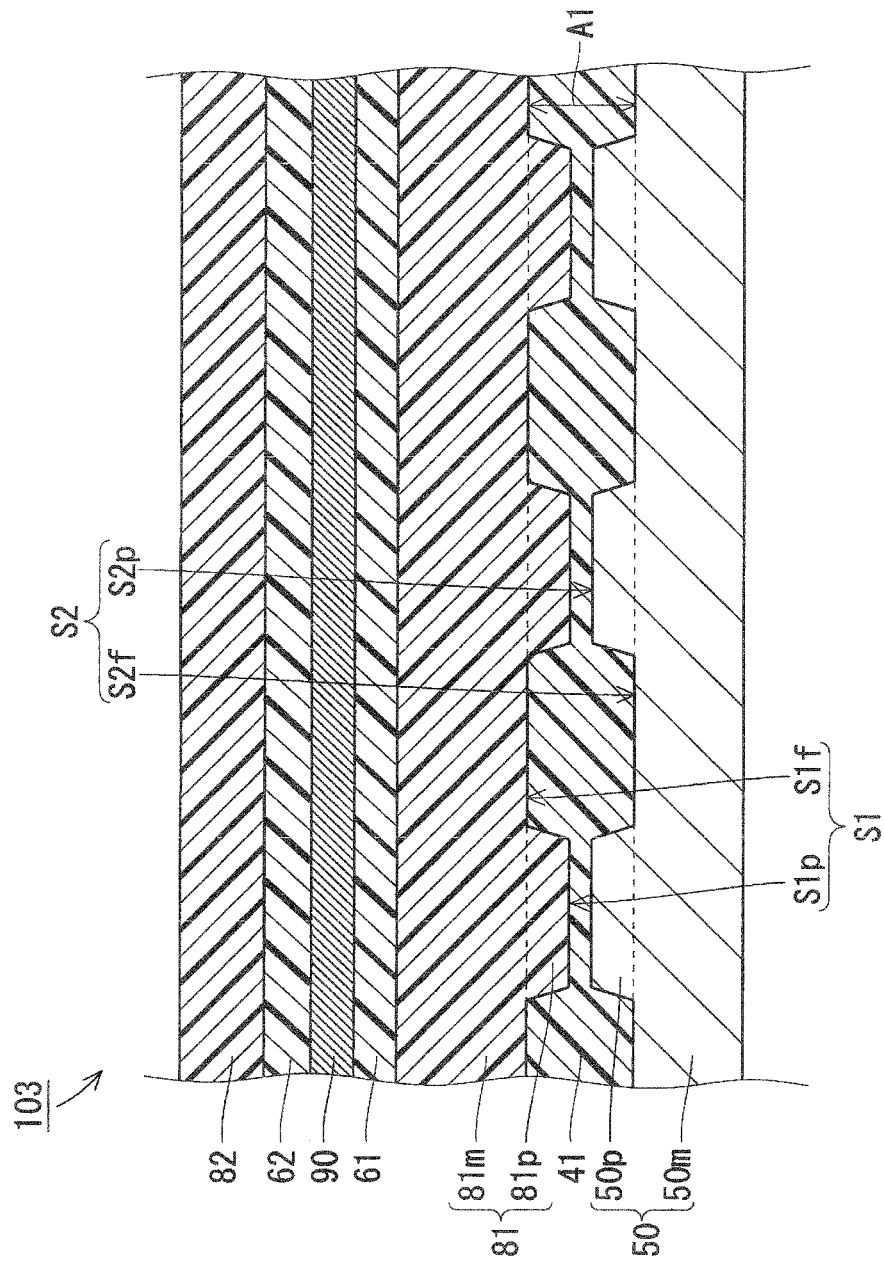
FIG. 11 is a partial cross-sectional view schematically showing a configuration of a package in Embodiment 3 of the present invention.

FIG. 11 is a partial cross-sectional view schematically showing a configuration of a package 103 in Embodiment 3. The package 103 includes the frame 81 and the heat sink plate 50 each being a member including a protruding portion and a flat portion. In particular, in the present embodiment, the protruding portion S1p of the frame 81 and the protruding portion S2p of the heat sink plate 50 substantially entirely overlap each other in plan layout.

According to the present embodiment, the adhesive layer 41 can have a larger thickness between the flat portion S1f and the flat portion S2f than between the protruding portion S1p and the protruding portion S2p. The adhesive layer 41 can thus easily and surely have a sufficiently thick portion. The sufficiently thick portion is elastically deformed to relieve stress caused by a difference in thermal expansion between the frame 81 and the heat sink plate 50. Hermeticity deterioration caused by repeated temperature changes made to the package 103 can thereby be suppressed.

Figure 12:
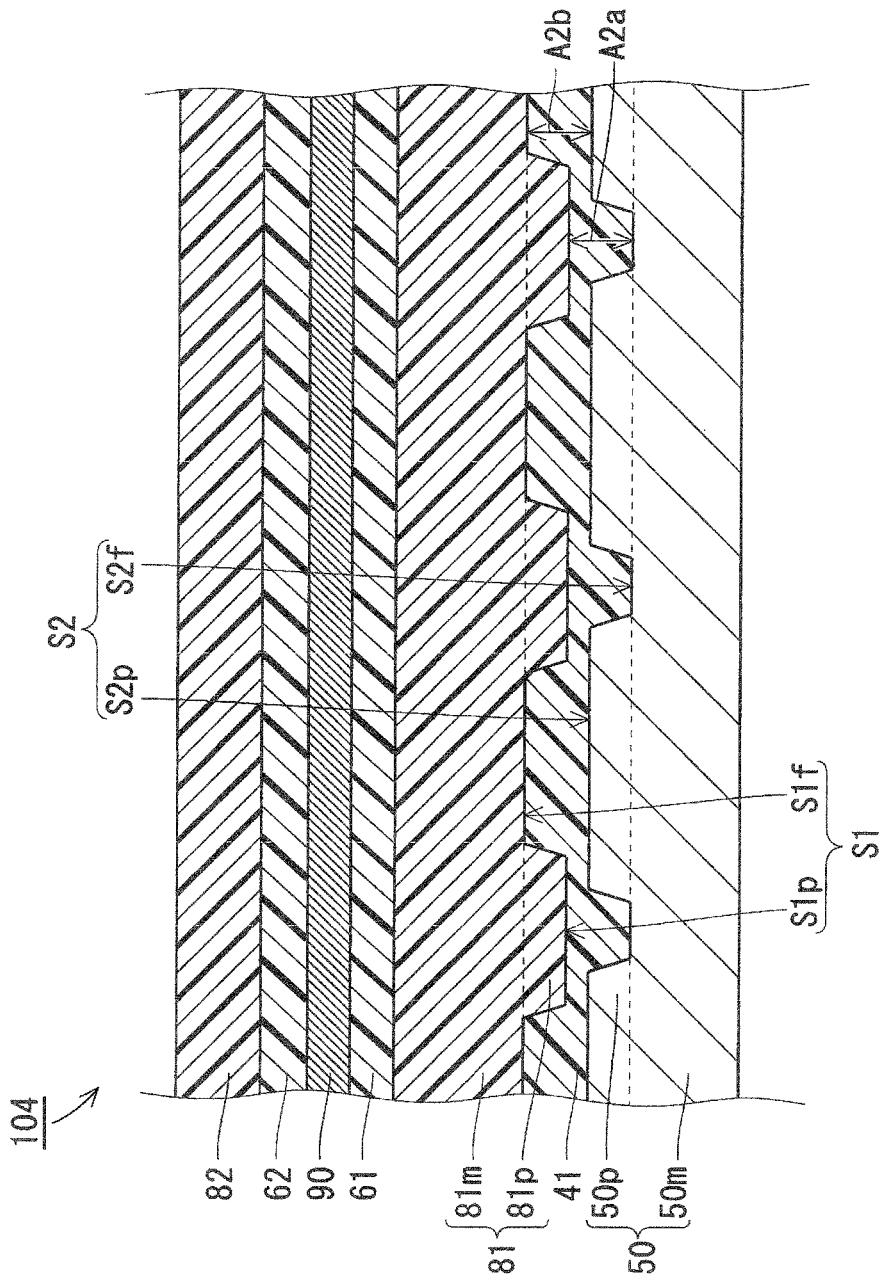
FIG. 12 is a partial cross-sectional view schematically showing a first modification of FIG. 11.

FIG. 12 is a partial cross-sectional view schematically showing a package 104 in a first modification. In the present modification, the protruding portion S1p of the frame 81 and the protruding portion S2p of the heat sink plate 50 only partially overlap each other in plan layout. According to the modification, an effect that is substantially the same as that obtained in the above-mentioned present embodiment can be obtained.

Figure 13:
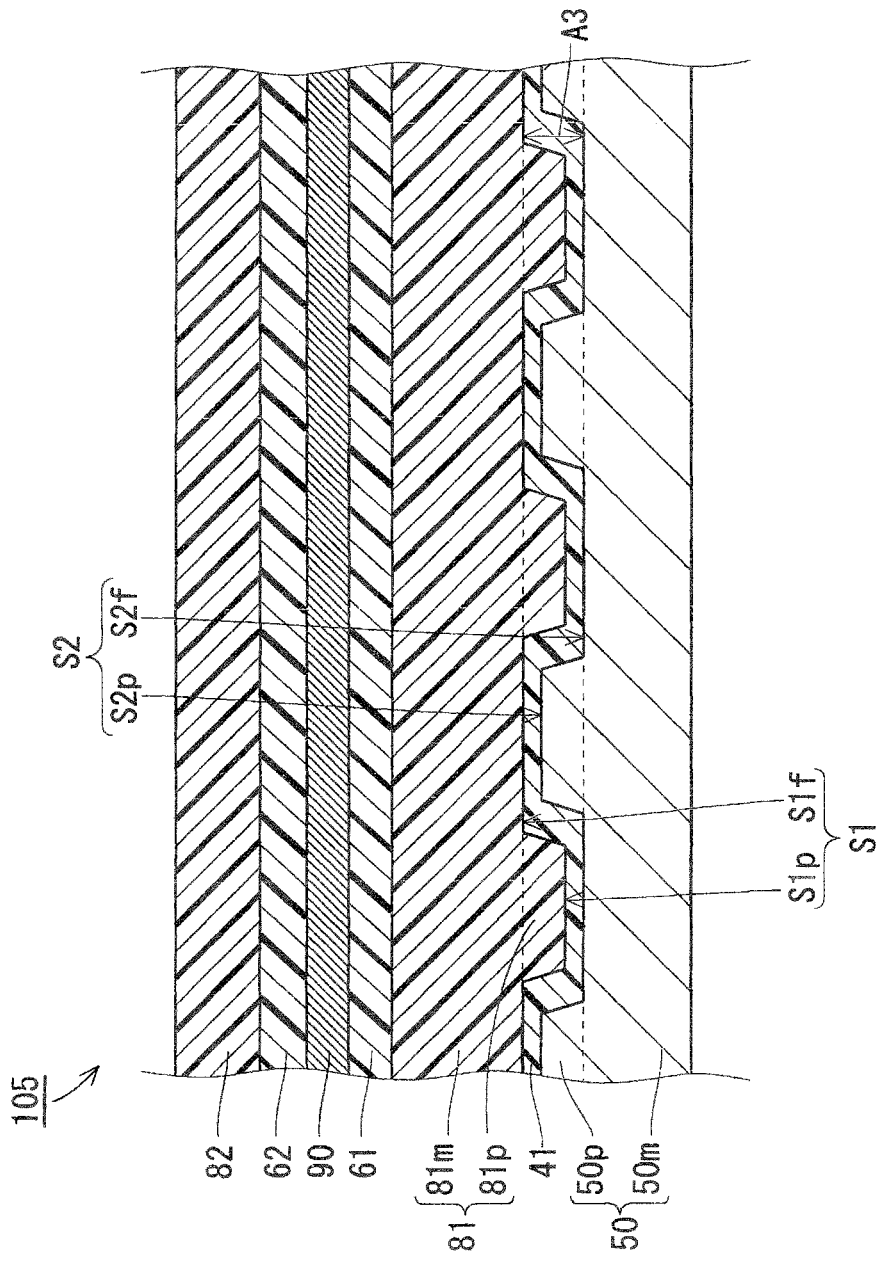
FIG. 13 is a partial cross-sectional view schematically showing a second modification of FIG. 11.

FIG. 13 is a partial cross-sectional view schematically showing a package 105 in a second modification. In the present modification, the protruding portion S1p of the frame 81 and the protruding portion S2p of the heat sink plate 50 are arranged to be offset from each other in plan layout. According to the modification, an effect close to that obtained in the above-mentioned present embodiment can be obtained. In particular, according to the present modification, the protruding portion S1p of the frame 81 and the protruding portion S2p of the heat sink plate 50 are offset from each other in plan layout, so that the adhered surface S1 of the frame 81 and the adhered surface S2 of the heat sink plate 50 can be arranged to further engage with each other. The volume of the adhesive layer 41 between adjacent protruding portions S2p (or adjacent protruding portions S1p) is thereby suppressed. This has an advantage that embedment in the adhesive layer 41 is less likely to be insufficient.

Embodiment 4

Figure 14:
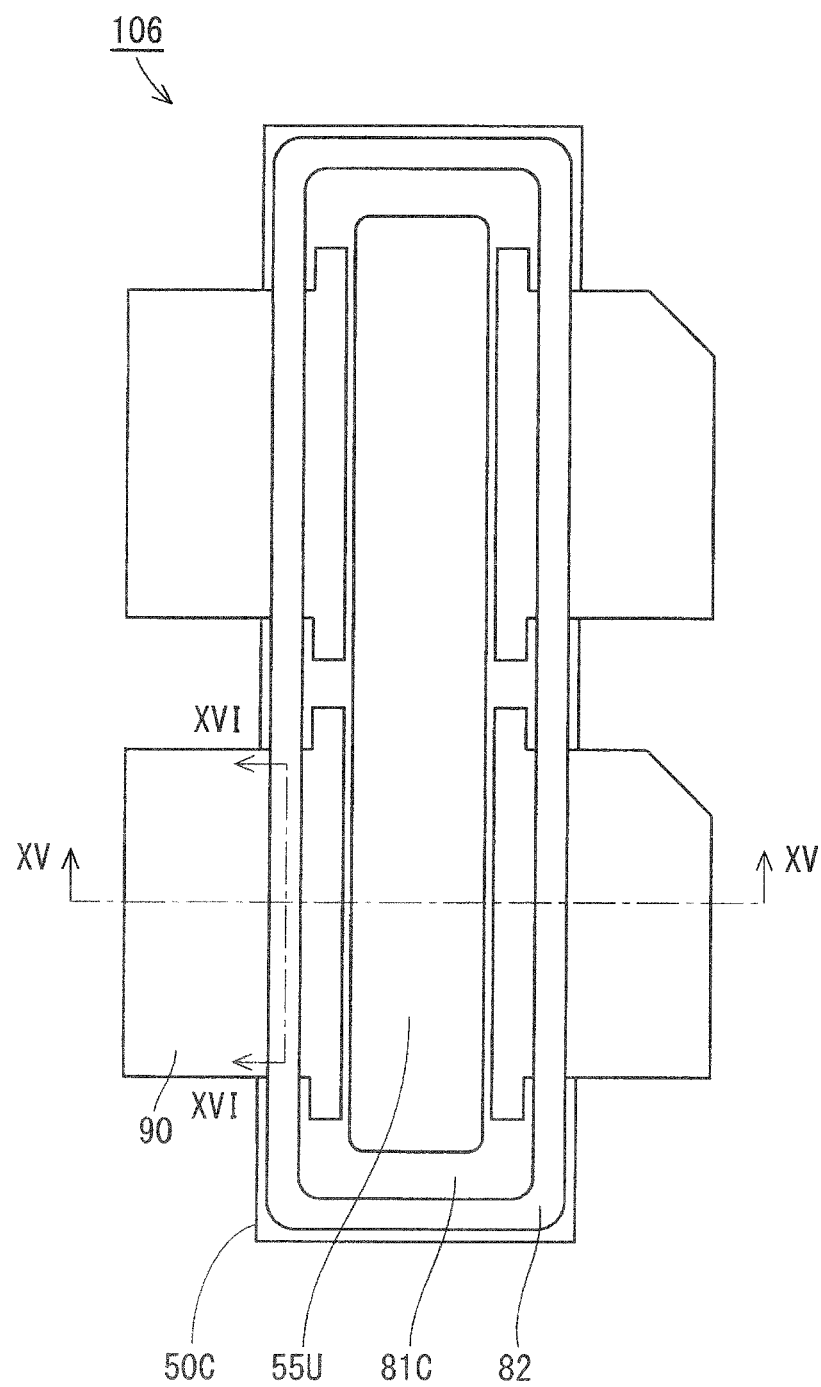
FIG. 14 is a top view schematically showing a configuration of a package in Embodiment 4 of the present invention.
Figure 15:
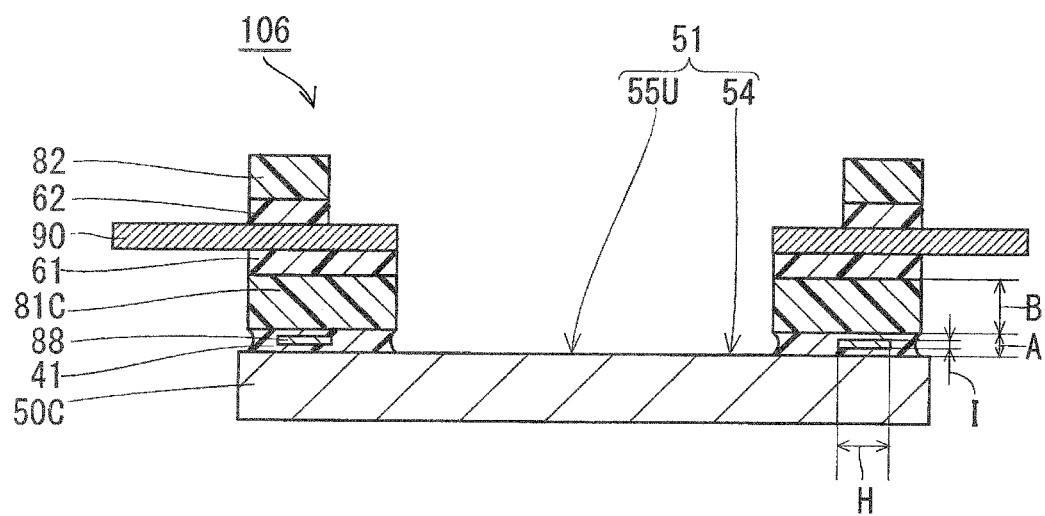
FIG. 15 is a schematic cross-sectional view taken along the line XV-XV of FIG. 14.
Figure 16:
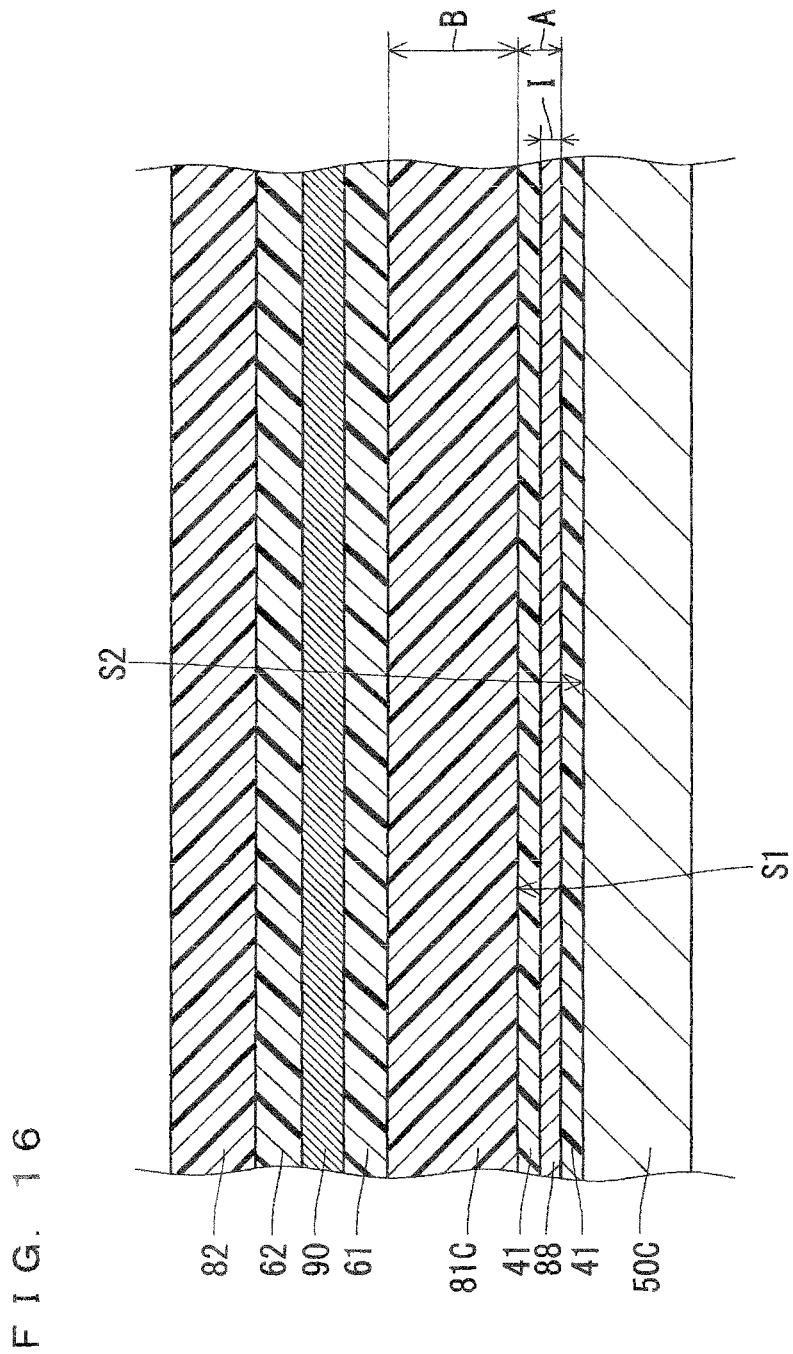
FIG. 16 is a schematic partial cross-sectional view taken along the line XVI-XVI of FIG. 14.

FIG. 14 is a top view schematically showing a configuration of a package 106 in Embodiment 4. FIG. 15 and FIG. 16 are schematic partial cross-sectional views respectively taken along the line XV-XV and the line XVI-XVI of FIG. 14. As with the package 101 (FIG. 2: Embodiment 1), the package 106 in the present embodiment is a package to which the lid 300 is to be attached to form the sealed space 950 for sealing the power semiconductor element 200 without a gross leak.

The package 106 includes an insert member 88. The insert member 88 is disposed within the adhesive layer 41. The insert member 88 has a smaller area than the frame 81C in plan layout. A material for the insert member 88 is not particularly limited, and the insert member 88 may be made of metal, resin, or resin in which an inorganic filler is dispersed, for example. The resin is preferably a thermosetting resin in terms of productivity of the insert member 88. The thermosetting resin is suitable for a manufacturing process in which injection molding or the like is used.

Figure 17:
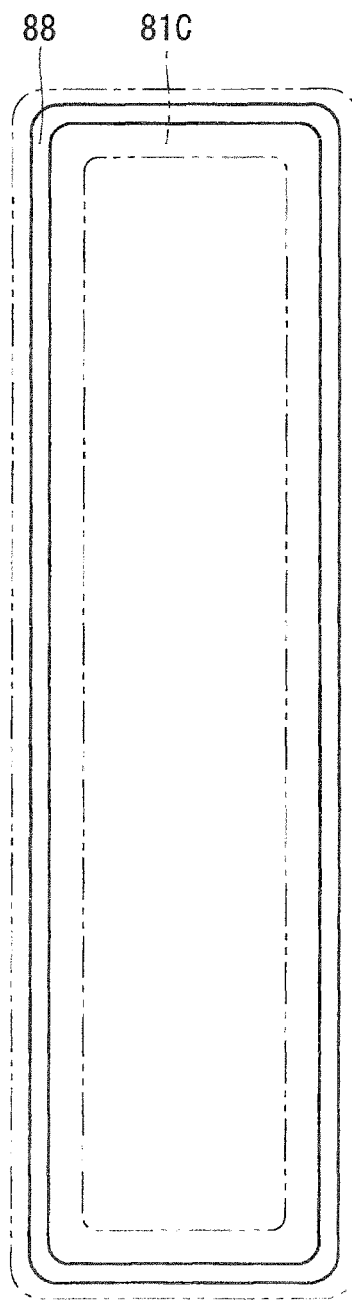
FIG. 17 is a bottom view schematically showing a configuration of an insert member in Embodiment 4 of the present invention.
Figure 18:
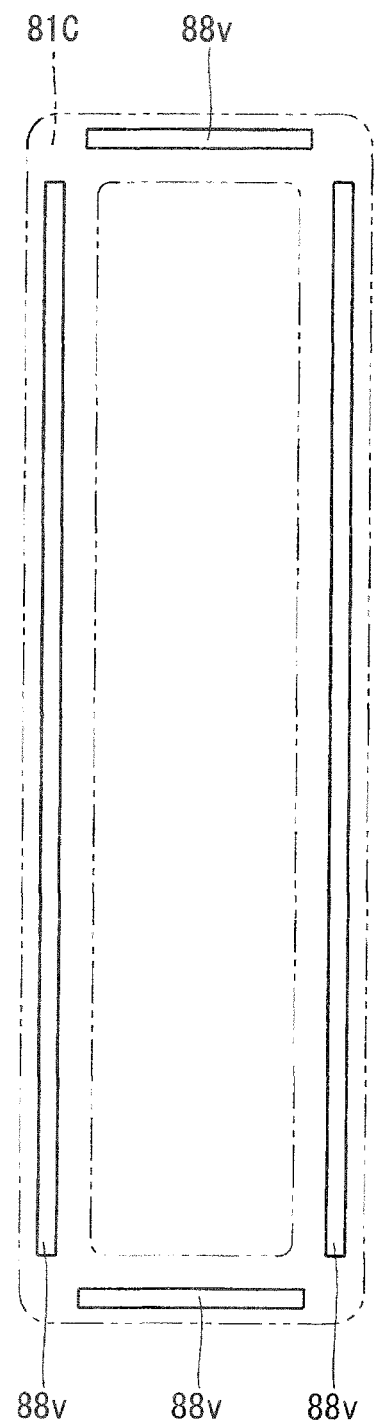
FIG. 18 is a bottom view schematically showing a modification of FIG. 17.

FIG. 17 is a bottom view schematically showing a configuration of the insert member 88 (FIGS. 15 and 16) as well as disposition of the frame 81C in plan layout in imaginary lines. In the present embodiment, the insert member 88 has an opening and a frame portion continuously surrounding the opening. In other words, the insert member 88 has a closed shape extending along the periphery of the frame 81C. In this case, the insert member 88 has a maximum dimension of more than 1 mm in view of the size of the frame 81C. FIG. 18 is a bottom view schematically showing a modification of FIG. 17. In the present modification, a plurality of insert members 88v are used. Each of the insert members 88v preferably has a maximum dimension of more than 1 mm.

A method for manufacturing the package 106 will be described next. A paste layer to become the adhesive layer 41 by being cured is first applied to the heat sink plate 50C. The insert member 88 is disposed on the paste layer. The insert member 88 gradually sinks into the paste layer under its own weight. The paste layer spreads to a top surface of the insert member 88 by interfacial tension. The frame 81C is then mounted on the paste layer. A stacked structure of a paste layer to become the electrode adhesive layer 61 by being cured, the external terminal electrode 90, a paste layer to become the electrode adhesive layer 62 by being cured, and the upper frame 82 is then formed on the frame 81C. The above-mentioned paste layers are then collectively cured by heat treatment at 200° C. for three hours. The package 106 is thereby obtained.

The other configuration is substantially the same as that in Embodiment 1 or 2 described above, and thus the same or corresponding components bear the same reference signs, and description thereof is not repeated. A method for manufacturing the power semiconductor module using the package 106 in the present embodiment is substantially similar to the method for manufacturing the power semiconductor module 900 (FIGS. 1 and 2) using the package 101, and thus description thereof is omitted.

(Effects)

According to the package 106 in the present embodiment, the insert member 88 is disposed within the adhesive layer 41 adhering the adhered surface S1 of the frame 81C and the adhered surface S2 of the heat sink plate 50C to each other. The adhesive layer 41 can thus have a larger thickness between the adhered surface S1 and the adhered surface S2 offset from the insert member 88 than between the insert member 88 and each of the adhered surface S1 and the adhered surface S2. The adhesive layer 41 can thus easily and surely have a sufficiently thick portion. The sufficiently thick portion is elastically deformed to relieve stress caused by the difference in thermal expansion between the frame 81C and the heat sink plate 50C. Hermeticity deterioration caused by repeated temperature changes made to the package 106 can thereby be suppressed.

Furthermore, the adhesive layer 41 can be cured in a state of having a larger thickness A (FIG. 15) by providing the insert member 88. The fluid layer to become the adhesive layer 41 by being cured is thus less likely to be pushed to the unmounted region 55U. The occurrence of bleeding can thus be suppressed.

The insert member 88 may contain a resin. In this case, the insert member 88 is likely to be elastically deformed. Stress caused by the difference in thermal expansion between the frame 81C and the beat sink plate 50C is thus further relieved.

The insert member 88 (each of the insert members 88v) preferably has a maximum dimension of more than 1 mm. An effect of the insert member can thus be obtained without the need for a process of arranging many insert members.

According to the method for manufacturing the power semiconductor module in the present embodiment, after formation of the package 106, the power semiconductor element 200 (see FIG. 2) is mounted on the heat sink plate 50C of the package 106. Thus, after formation of the adhesive layer 41 adhering the frame 81C and the heat sink plate 50C to each other, the power semiconductor element 200 is mounted on the heat sink plate 50C. Heating is required for the mounting, and thus the temperature of the adhesive layer 41 increases. If the adhesive layer 41 does not have the sufficiently thick portion, the effect of relieving, by the adhesive layer 41, stress caused by the difference in thermal expansion between the frame 81C and the heat sink plate 50C is likely to be small. As a result, hermeticity deterioration is likely to be caused by the repeated temperature changes made to the package. In contrast, according to the method for manufacturing the power semiconductor module in the present embodiment, the insert member 88 is disposed within the adhesive layer 41 adhering the adhered surface S1 of the frame 81C and the adhered surface S2 of the heat sink plate 50C to each other. The adhesive layer 41 can thus have a larger thickness between the adhered surface S1 and the adhered surface S2 offset from the insert member 88 than between the insert member 88 and each of the adhered surface S1 and the adhered surface S2. The adhesive layer 41 can thus easily and surely have the sufficiently thick portion. The sufficiently thick portion is elastically deformed to relieve stress caused by the difference in thermal expansion between the frame 81C and the heat sink plate 50C. Hermeticity deterioration caused by the repeated temperature changes made to the package 106 can thereby be suppressed.

It is preferable that, when the power semiconductor element 200 (see FIG. 2) is mounted, the unmounted region 55U (FIG. 15) of the heat sink plate 50C and the power semiconductor element 200 be joined to each other through the joining layer 42 (see FIG. 2) containing the thermosetting resin and the metal. The joining layer 42 contains the metal to enhance heat dissipation from the power semiconductor element 200 to the heat sink plate 50C. The joining layer 42 contains the resin to relieve thermal stress applied from the heat sink plate 50C to the power semiconductor element 200 through the joining layer 42. Rupture of the power semiconductor element 200 due to thermal stress is thus less likely to occur.

<Experiments>

Comparative examples 1 to 3 corresponding to the package 100 (FIG. 7) were studied. Ten samples were manufactured for each of the examples. The results are shown in Table 1 below.

TABLE 1

| COMPARATIVE EXAMPLE | ADHESIVE LAYER | | FRAME | | EVALUATION (NUMBER OF DEFECTS/NUMBER OF TEST SAMPLES) | | | | |
|---|---|---|---|---|---|---|---|---|---|
| | THICKNESS A [mm] | NUMBER OF APPLICATIONS | THICKNESS B [mm] | WIDTH C [mm] | VISUAL INSPECTION | | GROSS LEAK TEST AFTER TEMPERATURE CYCLES | | |
| | | | | | BLEEDING | GAP | 10 CYCLES | 100 CYCLES | 500 CYCLES |
| 1 | 0.05 | 1 | 0.3 | 2.1 | 10/10 | 0/10 | 10/10 | — | — |
| 2 | 0.10 | 2 | 0.3 | 2.1 | 10/10 | 0/10 | 0/10 | 0/10 | 2/10 |
| 3 | 0.15 | 2 | 0.3 | 2.1 | 10/10 | 0/10 | 0/10 | 0/10 | 0/10 |

In the respective comparative examples 1, 2, and 3, the adhesive layers 41 had thicknesses A of 0.05 mm, 0.10 mm, and 0.15 mm. The adhesive layer 41 in the comparative example 1 was formed by applying a paste to the heat sink plate 50C once to form a paste layer, disposing the frame 81C on the paste layer, and curing the paste layer. The adhesive layer 41 in the comparative example 2 was formed by applying a paste to the heat sink plate 50C once, heating the paste for semi-curing, and applying the paste to the semi-cured layer again to form a paste layer, disposing the frame 81C on the paste layer, and curing the paste layer. The adhesive layer 41 in the comparative example 3 was formed to be thicker by increasing the quantity of paste applied to the semi-cured layer. As a material for the adhesive layer 41, the electrode adhesive layer 61, and the electrode adhesive layer 62, a mixture of an epoxy resin as the thermosetting resin and silica glass being substantially spherical and having a maximum diameter of 35 μm as the filler was used. The adhesive layer 41 was completely cured by heat treatment at 200° C. for three hours. The electrode adhesive layer 61 and the electrode adhesive layer 62 were cured at the same time as the heat treatment.

The frame 81C (FIG. 7) had a thickness B of 0.3 mm and a width C of 2.1 mm. As a material for the frame 81C and the upper frame 82, a liquid crystal polymer as the thermoplastic resin was used. As the heat sink plate 50C, a copper plate to which a nickel-plated layer and a gold-plated layer were applied was used. As the external terminal electrode 90, a thin copper plate to which a nickel-plated layer and a gold-plated layer were applied was used.

As visual inspection of the package 100 formed as described above, bleeding and a gap were observed. The visual inspection for bleeding is inspection in which a defect is determined when the adhesive layer 41 has flowed to the unmounted region 55U. As shown in Table 1 above, bleeding was seen in all the ten samples for each of the comparative examples 1 to 3. The visual inspection for a gap is inspection in which a defect is determined when the adhesive layer 41 has a gap connecting the unmounted region 55U and the exterior. As shown in Table 1 above, no gap was seen in all the ten samples for each of the comparative examples 1 to 3.

The lid 300 (see FIG. 2) was then attached to the package 100 using the adhesive layer 46 (see FIG. 2) made of the epoxy resin. The sealed space 950 (see FIG. 2) was thereby formed. Heat treatment at 190° C. was performed for curing of the adhesive layer 46.

A gross leak test after temperature cycles was then conducted. As the temperature cycles, the examples were first subjected to ten cycles of a temperature change between −65° C. and +150° C., further subjected to up to 100 cycles of the temperature change, and even further subjected to up to 500 cycles of the temperature change. The temperature change simulates a temperature change to which the power semiconductor module installed in a harsh external environment is subjected. No gross leak is required to be seen after the above-mentioned temperature cycles in the package used in the harsh external environment. Specifically, the gross leak test is a test in which each of the samples is immersed, for 30 seconds, in Fluorinert™ as a high boiling point solvent heated to 120° C.±10° C., and a defect is determined when bubbles are generated during immersion. As shown in Table 1 above, resistance to the gross leak test was improved generally in proportion to the thickness A. In each of the comparative examples 2 and 3, however, the paste was applied a plurality of times to form the adhesive layer 41 having a large thickness A, adding to a large burden in the process.

Working examples 4 to 16 corresponding to the package 101 (FIG. 4) were also studied. Ten samples were manufactured for each of the examples. The results are shown in Table 2 below.

TABLE 2

| | ADHESIVE LAYER | | MAJOR PORTION OF FRAME | | PROTRUDING PORTION OF FRAME | | | | VISUAL INSPECTION | | GROSS LEAK TEST AFTER TEMPERATURE CYCLES | | |
| --- | --- | --- | --- | --- | --- | --- | --- | --- | --- | --- | --- | --- | --- |
| WORKING EXAMPLE | THICKNESS A [mm] | NUMBER OF APPLICATIONS | THICKNESS B [mm] | WIDTH C [mm] | WIDTH D [mm] | LENGTH E [mm] | DISTANCE F [mm] | HEIGHT G [mm] | BLEEDING | GAP | 10 CYCLES | 100 CYCLES | 500 CYCLES |
| 4 | 0.07 | 1 | 0.3 | 2.1 | 0.5 | 1 | 1 | 0.02 | 0/10 | 0/10 | 7/10 | 3/3 | — |
| 5 | 0.10 | 1 | 0.3 | 2.1 | 0.5 | 1 | 1 | 0.05 | 0/10 | 0/10 | 0/10 | 0/10 | 2/10 |
| 6 | 0.15 | 1 | 0.3 | 2.1 | 0.5 | 1 | 1 | 0.10 | 0/10 | 0/10 | 0/10 | 0/10 | 0/10 |
| 7 | 0.30 | 1 | 0.3 | 2.1 | 0.5 | 1 | 1 | 0.25 | 5/10 | 1/10 | 0/9 | 0/9 | 0/9 |
| 8 | 0.15 | 1 | 0.3 | 2.1 | 1.0 | 1 | 1 | 0.10 | 0/10 | 0/10 | 0/10 | 0/10 | 0/10 |
| 9 | 0.15 | 1 | 0.3 | 2.1 | 1.5 | 1 | 1 | 0.10 | 2/10 | 0/10 | 0/10 | 0/10 | 3/10 |
| 10 | 0.15 | 1 | 0.3 | 2.1 | 1.8 | 1 | 1 | 0.10 | 3/10 | 0/10 | 0/10 | 2/10 | 6/8 |
| 11 | 0.20 | 1 | 0.3 | 2.1 | 1.5 | 1 | 1 | 0.15 | 5/10 | 0/10 | 0/10 | 0/10 | 0/10 |
| 12 | 0.25 | 1 | 0.3 | 2.1 | 1.5 | 1 | 1 | 0.20 | 0/10 | 0/10 | 0/10 | 0/10 | 0/10 |
| 13 | 0.15 | 1 | 0.3 | 2.1 | 0.5 | 5 | 1 | 0.10 | 0/10 | 0/10 | 0/10 | 0/10 | 0/10 |
| 14 | 0.15 | 1 | 0.3 | 2.1 | 0.5 | 1 | 2 | 0.10 | 0/10 | 3/10 | 0/7 | 0/7 | 0/7 |
| 15 | 0.15 | 1 | 0.3 | 2.1 | 0.5 | 1 | 3 | 0.10 | 0/10 | 7/10 | 0/3 | 0/3 | 0/3 |
| 16 | 0.30 | 1 | 0.3 | 2.1 | 0.5 | 1 | 2 | 0.25 | 3/10 | 8/10 | 0/2 | 0/2 | 0/2 |

The thickness A, the thickness B, the width C, the width D, the length E, the distance F, and the height G in Table 2 above are dimensions shown in FIGS. 4 to 6. Materials for respective members were the same as those in the above-mentioned comparative examples.

The working examples 4 to 16 were evaluated in a similar manner to the comparative examples 1 to 3. The results will be described below.

10 than in the working example 8. This is presumably because, due to an excessively large width D of the protruding portion S1$p$, the volume of the adhesive layer 41 is reduced, and, as a result, the stress relieving effect of the adhesive layer 41 is reduced.

The working examples 17 to 22 corresponding to the package 106 (FIG. 15) were also studied. Ten samples were manufactured for each of the examples. The results are shown in Table 3 below.

TABLE 3

| | ADHESIVE LAYER | | FRAME | | INSERT MEMBER | | | EVALUATION (NUMBER OF DEFECTS/ NUMBER OF TEST SAMPLES) | | | | |
|---|---|---|---|---|---|---|---|---|---|---|---|---|
| | | | | | | | | VISUAL INSPECTION | | GROSS LEAK TEST AFTER TEMPERATURE CYCLES | | |
| WORKING EXAMPLE | THICKNESS A [mm] | NUMBER OF APPLICATIONS | THICKNESS B [mm] | WIDTH C [mm] | WIDTH H [mm] | THICKNESS I [mm] | MATERIAL | BLEEDING | GAP | 10 CYCLES | 100 CYCLES | 500 CYCLES |
| 17 | 0.15 | 1 | 0.3 | 2.1 | 0.5 | 0.05 | Cu | 0/10 | 0/10 | 0/10 | 0/10 | 0/10 |
| 18 | 0.15 | 1 | 0.3 | 2.1 | 0.5 | 0.05 | Fe | 0/10 | 0/10 | 0/10 | 0/10 | 0/10 |
| 19 | 0.15 | 1 | 0.3 | 2.1 | 0.5 | 0.05 | SAME AS FRAME | 0/10 | 0/10 | 0/10 | 0/10 | 0/10 |
| 20 | 0.15 | 1 | 0.3 | 2.1 | 1.0 | 0.05 | Cu | 0/10 | 0/10 | 0/10 | 0/10 | 0/10 |
| 21 | 0.15 | 2 | 0.3 | 2.1 | 1.5 | 0.05 | Cu | 3/10 | 0/10 | 0/10 | 0/10 | 0/10 |
| 22 | 0.15 | 2 | 0.3 | 2.1 | 2.1 | 0.05 | Cu | 5/10 | 0/10 | 0/10 | 0/10 | 1/10 |

In the visual inspection for bleeding, at least some proportion of samples was free of bleeding in each of the working examples 4 to 16 in contrast to the comparative examples 1 to 3. Specifically, defects of some proportion of samples were seen in each of the working examples 7 and 16. This is presumably because, due to an excessively large thickness A (FIG. 5) of the adhesive layer 41, the fluid layer to become the adhesive layer 41 by being cured is likely to flow to the unmounted region 55U (FIG. 4). In each of the working examples 9 to 11, defects of some proportion of samples were seen. This is presumably because, due to an excessively large width D (FIG. 4) of the protruding portion S1$p$ relative to the width C of the frame, the fluid layer to become the adhesive layer 41 by being cured is likely to be pushed to the unmounted region 55U.

In the visual inspection for a gap, a defect of one out of ten samples was seen in the working example 7. This is presumably because, due to an excessively large height G (FIG. 5) of the protruding portion S1$p$, filling of a gap between adjacent protruding portions S1$p$ with the adhesive layer 41 is likely to be incomplete. Defects of three out of ten samples were seen in the working example 14, and defects of seven out of ten samples were seen in the working example 15. This is presumably because, due to an excessively large distance F (FIG. 5) between protruding portions S1$p$, filling of a gap between adjacent protruding portions S1$p$ with the adhesive layer 41 is likely to be incomplete. Defects of eight out of ten samples were seen in the working example 16. This is presumably because of both of the above-mentioned two reasons.

The gross leak test after the temperature cycles was conducted for samples in which no gap was seen in the visual inspection. Referring to the working examples 4 to 6, with increasing height G of the protruding portion S1$p$, the thickness A of the adhesive layer 41 increases, and resistance to the gross leak test was improved. Resistance to the gross leak test was slightly lower in the working examples 9 and The thickness A, the thickness B, and the width C in Table 3 above are similar dimensions to those in the case of the comparative examples 1 to 3 (FIG. 7). The width H and the thickness I are dimensions shown in FIG. 15. As a material for the insert member 88 (FIG. 15), materials shown in Table 3 were used. Materials for the other members were the same as those in the above-mentioned comparative examples.

The method for manufacturing the package 106 described in Embodiment 4 was used in each of the working examples 17 to 20. In each of the working examples 21 and 22, a generally similar method was used while an additional paste layer was applied after the insert member 88 was mounted on the paste layer to become the adhesive layer 41 by being cured. Application of the paste layer to become the adhesive layer 41 by being cured was thus performed twice in each of the working examples 21 and 22.

The working examples 17 to 22 were evaluated in a similar manner to the comparative examples 1 to 3. The results will be described below.

In the visual inspection for bleeding, at least some proportion of samples was free of bleeding in each of the working examples 17 to 22 in contrast to the comparative examples 1 to 3. Specifically, defects of some proportion of samples were seen in each of the working examples 21 and 22. This is presumably because, due to an excessively large width H (FIG. 15) of the insert member 88 relative to the width C (see FIG. 4) of the frame, the fluid layer to become the adhesive layer 41 by being cured is likely to be pushed to the unmounted region 55U (FIG. 4). In the visual inspection for a gap, no defect was seen.

In the gross leak test after the temperature cycles, no defect was seen at all in each of the working examples 17 to 21. A defect of only one out of ten samples was seen in the working example 22. The result of the working example 22 was slightly poorer than the results of the working examples 17 to 21 presumably because, due to an excessively large width H of the insert member 88 made of Cu having greater rigidity than a resin, the insert member 88 and the adhesive layer 41 as a whole became slightly less elastic, and, as a result, the effect of relieving thermal stress by elasticity was reduced.

While the invention has been described in detail, the foregoing description is in all aspects illustrative and not restrictive. It is therefore understood that numerous unillustrated modifications can be devised without departing from the scope of the invention.

What is claimed is:

1. A package to which a lid is to be attached to form a sealed space for sealing a power semiconductor element without a gross leak, the package comprising:
   an external terminal electrode;
   a frame to which the external terminal electrode is attached, the frame containing a first resin and having a first adhered surface;
   a heat sink plate supporting the frame, having an unmounted region within the frame in plan view, made of metal, and having a second adhered surface, the unmounted region being a region where the power semiconductor element is to be mounted; and
   an adhesive layer containing a second resin different from the first resin and adhering the first adhered surface of the frame and the second adhered surface of the heat sink plate to each other, one of the first and second adhered surfaces including a flat portion and a protruding portion, the protruding portion protruding from the flat portion and opposing the other one of the first and second adhered surfaces with the adhesive layer therebetween, wherein
   the unmounted region is a region where the power semiconductor element is to be mounted while the power semiconductor element has not yet been mounted, and
   wherein hermeticity between the heat sink plate and the frame is heat resistant to heat treatment at 260° C. for two hours.

2. The package according to claim 1, wherein the metal of the heat sink plate is a non-composite material containing copper at a purity of 95.0 wt % or more.

3. The package according to claim 1, wherein the unmounted region is exposed.

4. The package according to claim 1, wherein the first adhered surface of the frame includes the flat portion and the protruding portion.

5. The package according to claim 1, wherein the protruding portion is tapered in a direction in which the protruding portion is protruding.

6. The package according to claim 1, wherein the adhesive layer has a concave side surface connecting the heat sink plate and the frame.

7. A method for manufacturing a power semiconductor module, the method comprising:
   preparing a package according to claim 1;
   after the preparing of the package, mounting a power semiconductor element on the unmounted region of the heat sink plate of the package; and
   attaching a lid to the frame of the package to seal the power semiconductor element without a gross leak.

8. The method for manufacturing the power semiconductor module according to claim 7, wherein
   the mounting of the power semiconductor element includes joining the unmounted region of the heat sink plate of the package and the power semiconductor element to each other through a joining layer containing a thermosetting resin and a metal.

9. A package to which a lid is to be attached to form a sealed space for sealing a power semiconductor element without a gross leak, the package comprising:
   an external terminal electrode;
   a frame to which the external terminal electrode is attached, the frame containing a first resin and having a first adhered surface;
   a heat sink plate supporting the frame, having an unmounted region within the frame in plan view, made of metal, and having a second adhered surface, the unmounted region being a region where the power semiconductor element is to be mounted;
   an adhesive layer containing a second resin different from the first resin, and adhering the first adhered surface of the frame and the second adhered surface of the heat sink plate to each other; and
   an insert member disposed within the adhesive layer, wherein
   the insert member contains a resin;
   the insert member has a maximum dimension of more than 1 mm; and
   the unmounted region is a region where the power semiconductor element is to be mounted while the power semiconductor element has not yet been mounted.

10. A method for manufacturing a power semiconductor module, the method comprising:
    preparing a package according to claim 9;
    after the preparing of the package, mounting a power semiconductor element on the unmounted region of the heat sink plate of the package; and
    attaching a lid to the frame of the package to seal the power semiconductor element without a gross leak.

11. The method for manufacturing the power semiconductor module according to claim 10, wherein
    the mounting of the power semiconductor element includes joining the unmounted region of the heat sink plate of the package and the power semiconductor element to each other through a joining layer containing a thermosetting resin and a metal.

* * * * *